US012751262B2

(12) United States Patent
Liu et al.

(10) Patent No.: US 12,751,262 B2
(45) **Date of Patent: *Sep. 29, 2026**

(54) TECHNOLOGIES FOR ALIGNED VIAS

(71) Applicant: Intel Corporation, Santa Clara, CA (US)

(72) Inventors: Changhua Liu, Chandler, AZ (US); Leonel R. Arana, Phoenix, AZ (US); Jeremy D. Ecton, Gilbert, AZ (US); Suddhasattwa Nad, Chandler, AZ (US); Brandon Christian Marin, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 427 days.

This patent is subject to a terminal disclaimer.

(21) Appl. No.: 17/351,536

(22) Filed: Jun. 18, 2021

(65) Prior Publication Data

US 2022/0406654 A1 Dec. 22, 2022

(51) Int. Cl.

| | |
|---|---|
| ***H10W 20/00*** | (2026.01) |
| ***G03F 7/00*** | (2006.01) |
| ***G03F 7/16*** | (2006.01) |
| ***H10P 76/20*** | (2026.01) |
| ***H10W 20/40*** | (2026.01) |

(Continued)

(52) U.S. Cl.

CPC ........ *H10W 20/089* (2026.01); *G03F 7/0035* (2013.01); *G03F 7/162* (2013.01); *H10P 76/2041* (2026.01); *H10W 20/042* (2026.01); *H10W 20/056* (2026.01); *H10W 20/435* (2026.01); *H10W 20/4421* (2026.01); *H10W 20/496* (2026.01); *H10W 20/497* (2026.01)

(58) Field of Classification Search

None

See application file for complete search history.

(56) References Cited

U.S. PATENT DOCUMENTS

2003/0027419 A1 2/2003 Chen
2010/0015805 A1 1/2010 Mayer et al.
(Continued)

FOREIGN PATENT DOCUMENTS

CN 112219164 A * 1/2021 ........... G03F 7/0002
WO WO-2014030581 A1 * 2/2014 ............ G02B 5/201

OTHER PUBLICATIONS

EPO; Extended European Search Report issued in EP Patent Application No. 22162572.6, dated Sep. 16, 2022; 8 pages.
(Continued)

*Primary Examiner* — Telly D Green
(74) *Attorney, Agent, or Firm* — Alliance IP, LLC

(57) ABSTRACT

Techniques for low- or zero-misaligned vias are disclosed. In one embodiment, a high-photosensitivity and low-photosensitivity photoresist are applied to a substrate and exposed at the same time with use of a dual-tone mask. After being developed, one photoresist forms an overhang over a sheltered region. The mold formed by the photoresists is filled with copper and then etched. The overhang prevents the top of the copper infill below the overhang region from being etched. As such, the sheltered region forms a pillar or column after etching, which can be used as a via. Other embodiments are disclosed.

25 Claims, 30 Drawing Sheets

(51) Int. Cl.
*H10W 20/41* (2026.01)
*H10W 20/44* (2026.01)

(56) References Cited

U.S. PATENT DOCUMENTS

| | | | | |
|---|---|---|---|---|
| 2013/0222936 | A1* | 8/2013 | Kawanishi | G02B 5/20<br>430/321 |
| 2014/0145329 | A1 | 5/2014 | Haba et al. | |
| 2015/0205019 | A1 | 7/2015 | Kawanishi | |
| 2015/0277099 | A1* | 10/2015 | Hong | G09G 3/2003<br>438/57 |
| 2016/0183370 | A1 | 6/2016 | Rawlings et al. | |
| 2017/0299960 | A1 | 10/2017 | Parker et al. | |
| 2018/0209046 | A1 | 7/2018 | Low et al. | |
| 2019/0206767 | A1 | 7/2019 | Aleksov et al. | |
| 2019/0304890 | A1* | 10/2019 | Ecton | H01L 21/4857 |
| 2020/0083154 | A1 | 3/2020 | Gavagnin et al. | |
| 2020/0126923 | A1 | 4/2020 | Hu et al. | |
| 2020/0211949 | A1 | 7/2020 | Strong et al. | |
| 2020/0219814 | A1 | 7/2020 | Strong et al. | |
| 2020/0258839 | A1 | 8/2020 | Aleksov et al. | |
| 2022/0406618 | A1 | 12/2022 | Liu et al. | |

OTHER PUBLICATIONS

USPTO Final Office Action received in U.S. Appl. No. 17/351,537, dated Feb. 13, 2025, 30 pages.
USPTO Final Office Action received in U.S. Appl. No. 17/351,537, dated Jul. 31, 2025, 29 pages.
USPTO Non-Final Office Action received in U.S. Appl. No. 17/351,537, dated Sep. 16, 2025, 30 pages.

* cited by examiner 4800
4802
4804
4806
4808
4810
4814
49
50

4800
4702
4806
4816
4818
4824
4826

4800
4702
4810
4812
4820
4822

TECHNOLOGIES FOR ALIGNED VIAS

BACKGROUND

Modern integrated circuits may have a large number of conductive traces connecting different components in the integrated circuit. In some cases, a redistribution layer of multiple layers of conductive traces may be used to connect components of an integrated circuit. The alignment of conductive traces and vias in different layers may impact how densely lines can be packed in the redistribution layer.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Forming inter-layer vias with several distinct patterning steps can lead to misalignment between a via pad formed in one patterning and a via in a second patterning. In order to reduce or eliminate the misalignment, in one embodiment disclosed herein, two photoresists with different photosensitivity are deposited on a substrate, with one on top of the other. The photoresists are exposed with a dual-tone mask, allowing the two photoresists to be exposed to different patterns using the same mask. After development, the bottom photoresist forms a mold corresponding to a desired conductive path and via, and the top photoresist forms an overhang that extends over the position of the desired via. Copper is plated to fill the mold and then etched back. The etching process etches the copper down to a desired thickness for the conductive path and partially etches under the overhang formed by the top photoresist. The etch process will not fully etch under the overhang, forming a via that is aligned to the conductive path beneath it.

Additionally or alternatively, in one embodiment, a first photoresist is applied, exposed, and developed on a substrate, forming a mold corresponding to both a desired conductive path on a substrate and a via. Copper is applied to fill the mold. A second photoresist is applied over the first photoresist and the copper in the mold formed by the first photoresist. The second photoresist is exposed and developed, leaving an opening over the desired conductive path (and not over the area for the via). The copper above the desired conductive path is etched away, leaving the conductive path and the via.

Figure 1:
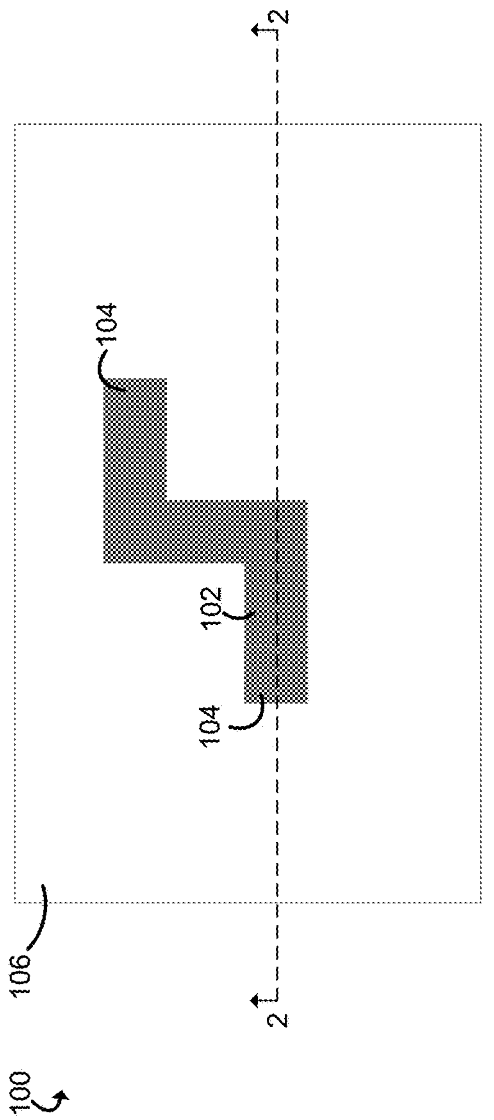
FIG. 1 is a top-down view of a simplified diagram of a system with a conductive trace and via on a substrate.
Figure 2:
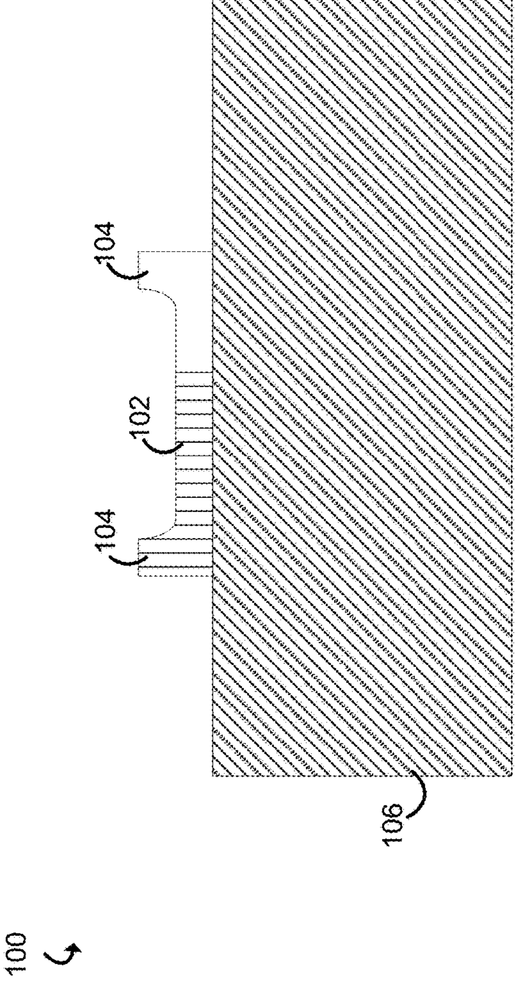
FIG. 2 is a cross-section view of the system of FIG. 1.

Referring now to FIGS. 1 & 2, in one embodiment, a system 100 includes a conductive trace 102 and two vias 104 on a substrate 106. The system 100 can be created as described in more detail below in regard to the method 300 described in FIG. 3 and as shown in FIGS. 4-19. It should be appreciated that, in the illustrative embodiment, the via 104 is positioned relative to the conductive trace 102 without misalignment. As such, a pad that is larger than the via 104 or conductive trace 102 is not required in order to compensate for any misalignment.

The conductive trace 102 and vias 104 may have any suitable dimensions. For example, in the illustrative embodiment, the conductive trace 102 may have a length of 10-200 micrometers, a width of 0.5-4 micrometers, and/or a thickness of 0.5-4 micrometers. The illustrative vias 104 may have a length and/or width of 0.5-4 micrometers and a thickness of 2-10 micrometers. In other embodiments, the conductive trace 102 may have, e.g., a length of 0.1-10,000 micrometers, a width of 0.05-40 micrometers, and/or a thickness of 0.05-40 micrometers. In other embodiments, the vias 104 may have, e.g., a length and/or width of 0.05-40 micrometers and/or a thickness of 0.1-100 micrometers. The conductive trace 102 and vias 104 may be any suitable material. In the illustrative embodiment, the trace 102 and vias 104 are copper. In other embodiments, the trace 102 and/or vias 104 (or any other traces or vias disclosed herein) may be another material, such as aluminum, gold, tungsten, tantalum, hafnium, zirconium, silver, tin, lead, metal alloys, metal carbides, doped semiconductor, etc.

In some embodiments, there may be multiple conductive traces 102 and/or vias 104 near each other. For example, in one embodiment, an array of conductive traces 102 may be connected to an array of vias 104. A pitch of the conductive traces 102 may be any suitable value, such as two to five times the width of the conductive traces 102. As there is little or no misalignment between the vias 104 and the conductive traces 102, the pitch of the vias 104 may be the same as that of the conductive traces 102. For example, the pitch of the vias 104 may be two to five times the width of the conductive traces 102.

The substrate 106 may be any suitable material. In the illustrative embodiment, the substrate 106 is silica. In other embodiments, the substrate 106 may be any suitable material, such as silicon, a III-V substrate, a dielectric, a semiconductor, a fiberglass-based material such as FR-4, etc.

The system 100 may include other components not shown in FIG. 1, such as other conductive traces, other vias, other structures such as transistors or capacitors, etc. The system 100 may include one or more layers above or below the conductive trace 102 and via 104. The system 100 may include components packaged into a package, such as a circuit board, an integrated heat spreader, one or more pins or contact pads, etc. The system 100 may be embodied as, form a part of, or include one or more single- or double-sided dies or one or more single- or double-sided wafers. The conductive trace 102 and via 104 may be surrounded by a dielectric layer (not shown) above the substrate 106. In some embodiments, the conductive trace 102 and via 104 may be part of a redistribution layer of an integrated circuit such as a processor. In other embodiments, the conductive trace 102 and via 104 may be part of any suitable device, such as a processor, a printed circuit board, an application-specific integrated circuit (ASIC), or any other suitable device.

Figure 3:
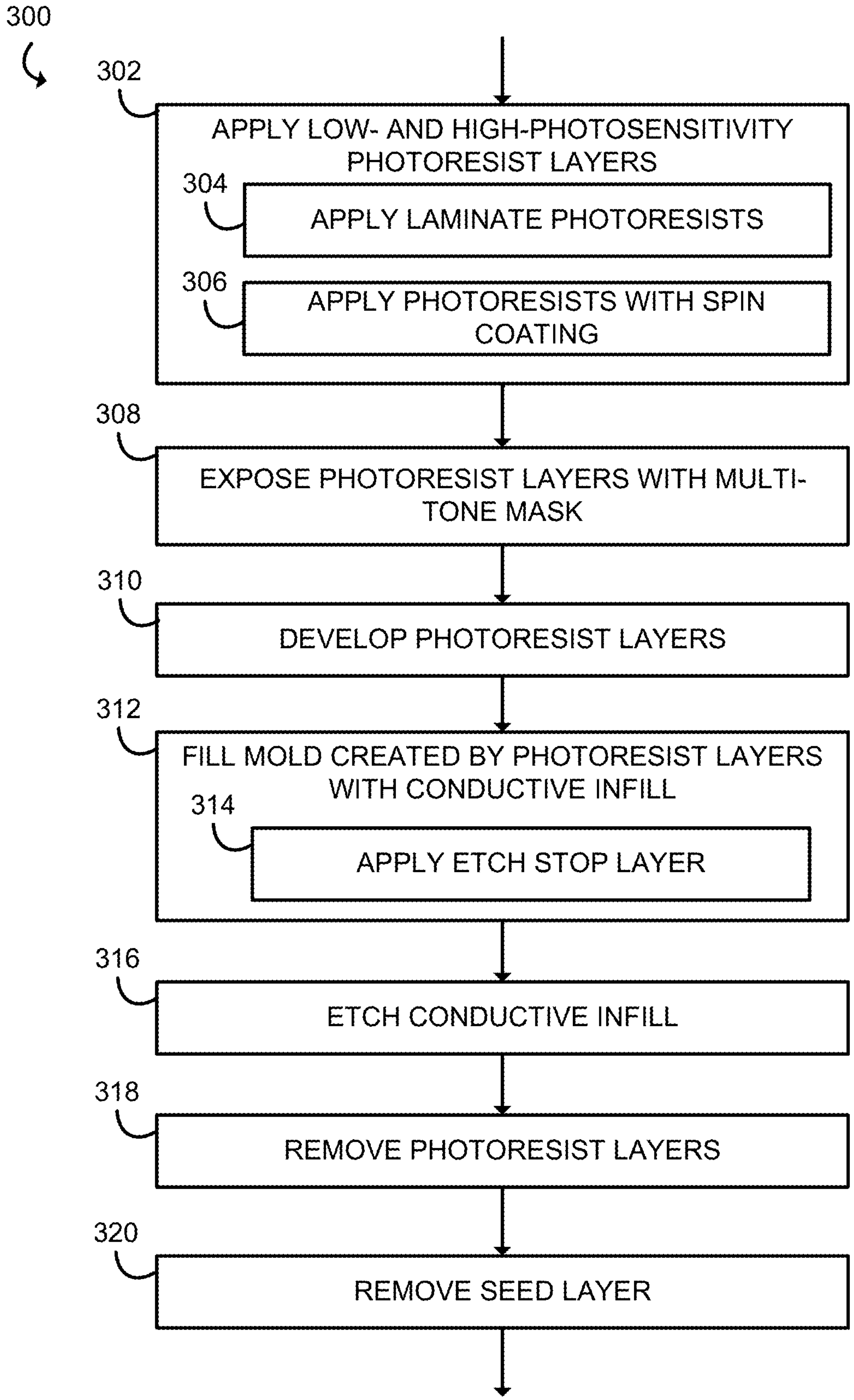
FIG. 3 is a simplified flow diagram of at least one embodiment of a method for creating the conductive trace and via of FIG. 1.
Figure 4:
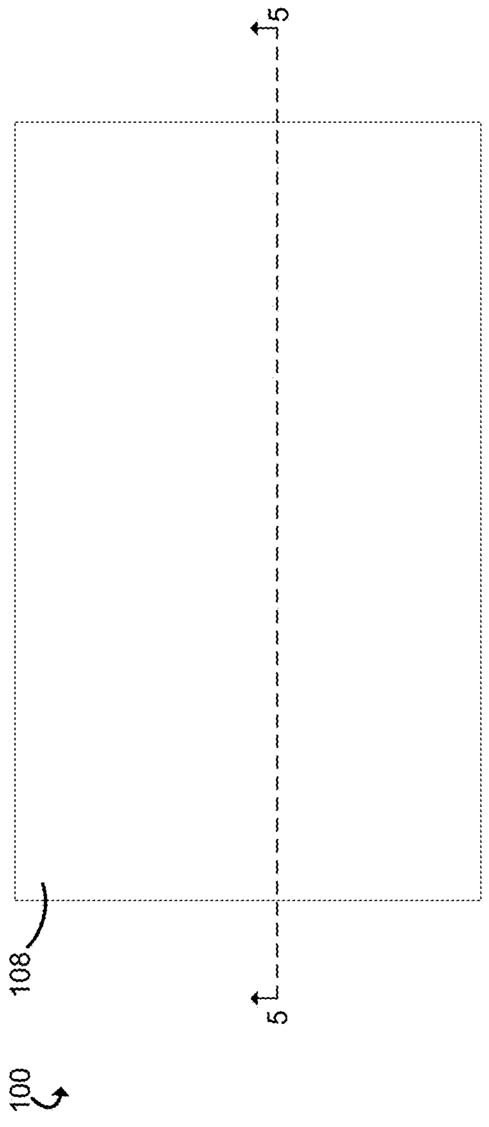
FIG. 4 is a top-down view of a system at one or more steps of the method of FIG. 3.
Figure 5:
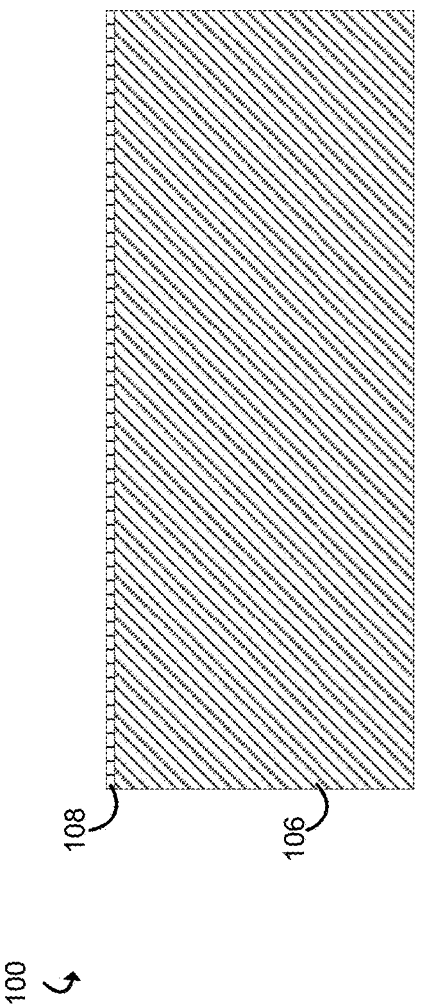
FIG. 5 is a cross-section view of the system of FIG. 4.
Figure 6:
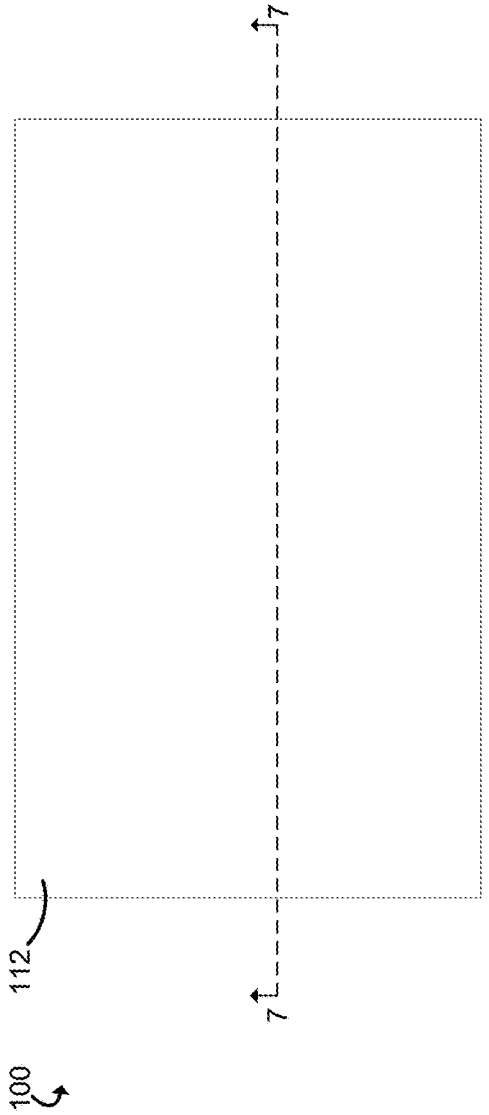
FIG. 6 is a top-down view of a system at one or more steps of the method of FIG. 3.
Figure 7:
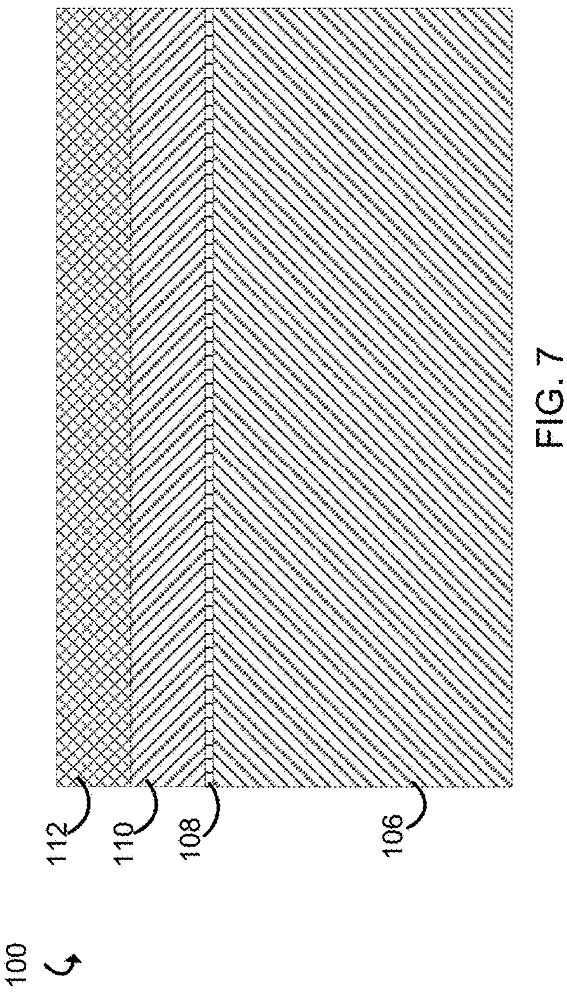
FIG. 7 is a cross-section view of the system of FIG. 6.

Referring now to FIG. 3, in one embodiment, a method 300 for creating a low- or zero-misaligned vias, such as the vias 104 shown in FIGS. 1 and 2, is shown. FIGS. 4-19 correspond to different stages of the method 300. FIGS. 5, 7, 9, 11, 13, 15, 17 and 19 correspond to cross-sections of FIGS. 4, 6, 8, 10, 12, 14, 16, and 18, respectively. The method 300 begins in block 302, in which a low-photosensitivity photoresist layer 110 and a high-photosensitivity photoresist layer 112 are applied to the substrate 106. In the illustrative embodiment, the photoresist layers 110, 112 are applied to the substrate by being applied to a seed layer 108 on the substrate 106. FIGS. 4 and 5 show the system 100 prior to application of the photoresist layers 110, 112, and FIGS. 6 and 7 show the system 100 after application of the photoresist layers 110, 112. The seed layer 108 may be any suitable material. In the illustrative embodiment, the seed layer 108 is copper. In other embodiments, the seed layer 108 may be another material, such as aluminum, gold, tungsten, tantalum, hafnium, zirconium, silver, tin, lead, metal alloys, metal carbides, doped semiconductor, etc. In the illustrative embodiment, the seed layer 108 is applied using any suitable technique, such as electroless plating, electroplating, sputtering, chemical vapor deposition, atomic layer deposition, etc. Some embodiments may not have a seed layer 108.

The photoresist layers 110, 112 may be made of any suitable photoresist. The difference in photosensitivity between the layers 110, 112 may be due to use of a different material or may be due to, e.g., a modulation of the photoinitiator or sensitizer concentrations in the photoresist material. The low-photosensitivity resist may also be referred to as a high-dose resist or a low-speed resist. The high-photosensitivity resist may also be referred to as a low-dose resist or a high-speed resist. In the illustrative embodiment, each of the photoresist layers 110, 112 is 0.5-4 micrometers thick. In other embodiments, the photoresist layer 110 and/or 112 may be any suitable thickness, such as 0.1-100 micrometers. In some embodiments, the photoresist layer 110 and/or 112 may be a photoimageable dielectric (PID) layer.

The photoresist layers 110, 112 may be applied in any suitable manner. For example, in the illustrative embodiment, the photoresist layers 110, 112 are applied as laminate photoresist layers 110, 112 in block 304. In other embodiments, in block 306, the photoresist layers 110, 112 are applied using spin coating. In the illustrative embodiment, each of the photoresist layers 110, 112 is a negative photoresist. As such, the portion of each photoresist layer 110, 112 that is exposed to a sufficient amount of light during exposure will remain in place after the unexposed portion has been removed. In other embodiments, the photoresist layer 110 and/or 112 may be a positive photoresist. Of course, certain aspects of the method 300 may be different with positive photoresists, such as the relative arrangement of the photoresist layers 110, 112 and the areas of the photoresist layers 110, 112 exposed to light during the exposure process.

Figure 8:
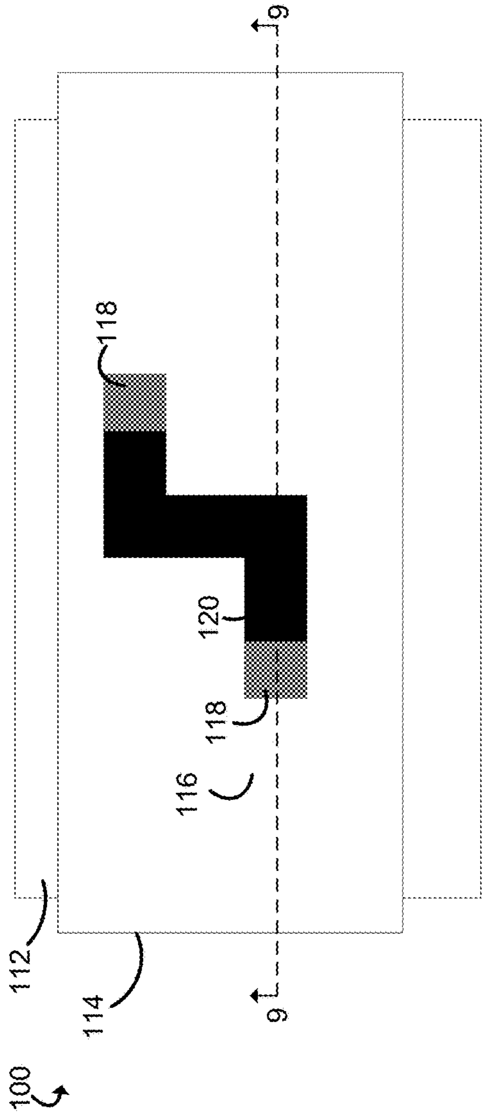
FIG. 8 is a top-down view of a system at one or more steps of the method of FIG. 3.
Figure 9:
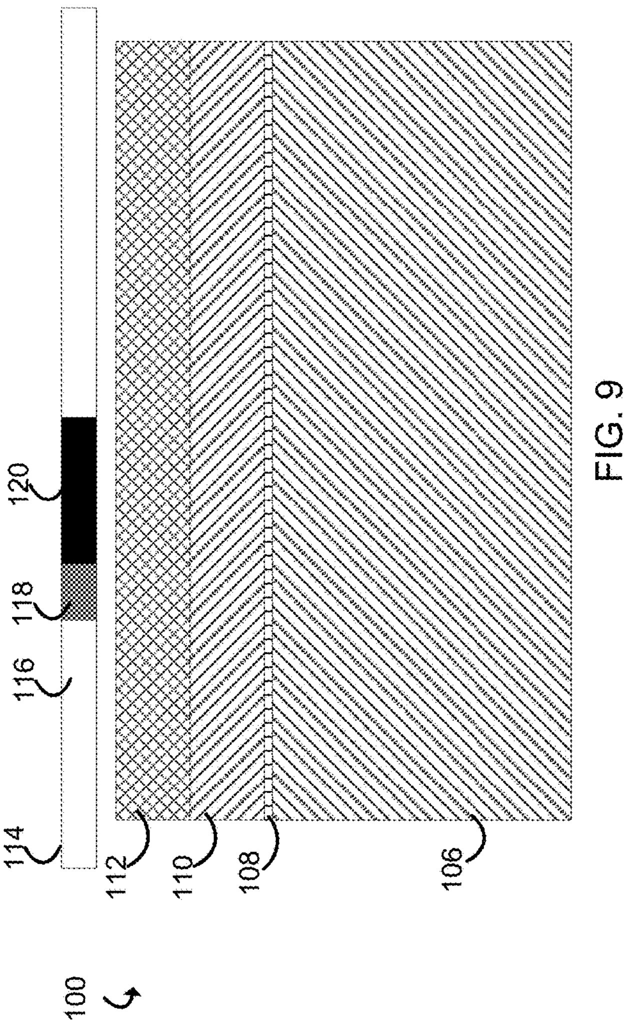
FIG. 9 is a cross-section view of the system of FIG. 8.

In block 308, the photoresist layers 110, 112 are exposed to ultraviolet light or other electromagnetic radiation with use of a multi-tone photomask 114 (see FIGS. 8 and 9). The electromagnetic radiation may be any suitable wavelength, such as 13 nanometers to 400 nanometers. In the illustrative embodiment, the mask 114 has one or more transparent light (or high-transmission) regions 116 that expose both photoresist layers 110, 112, one or more gray regions 118 that expose the high-photosensitivity layer 112 but not the low-photosensitivity layer 110, and one or more dark regions 120 that do not expose either layer 110, 112. As used herein, to "expose" a layer means to apply enough electromagnetic radiation at a suitable wavelength to part of the layer to cause a photochemical or other change that will result in part of the layer being removed after development while the rest of the layer remains after development. In the illustrative embodiment, the dark region 120 corresponds to where the conductive trace 102 will be, the gray regions 118 correspond to where the vias 104 will be, and the transparent region 116 corresponds to where neither a conductive trace 102 nor a via 104 will be. The light, gray, and dark regions may transmit any suitable amount of incoming light. For example, the dark regions 120 may transmit 0-35% of incoming exposure light, the gray regions 118 may transmit 35-70% of incoming exposure light, and the light region 116 may transmit 70-100% of incoming exposure light. The gray regions 118 will transmit more electromagnetic radiation at the wavelength in use than the dark regions 120, and the light regions 116 will transmit more electromagnetic radiation at the wavelength in use than the gray regions 118.

Figure 10:
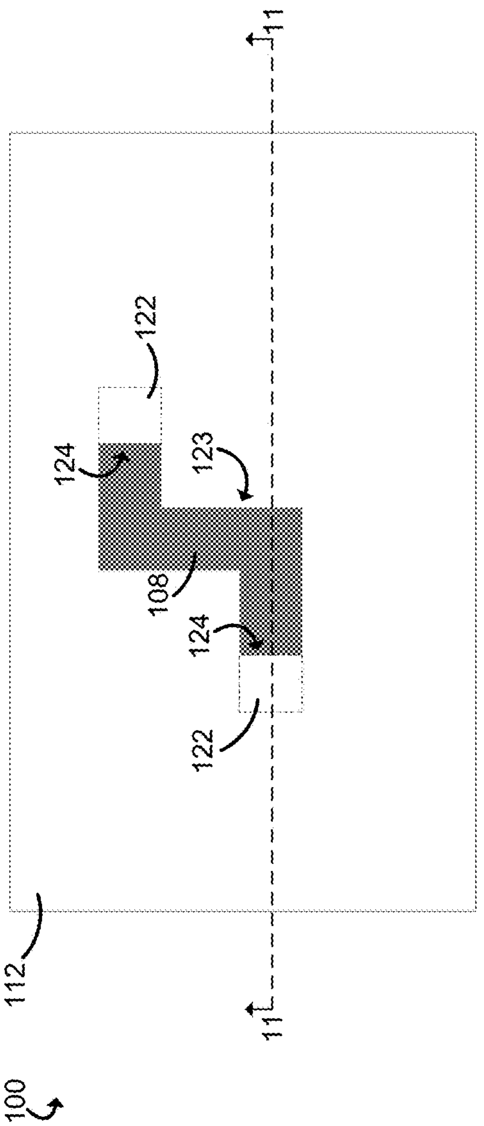
FIG. 10 is a top-down view of a system at one or more steps of the method of FIG. 3.
Figure 11:
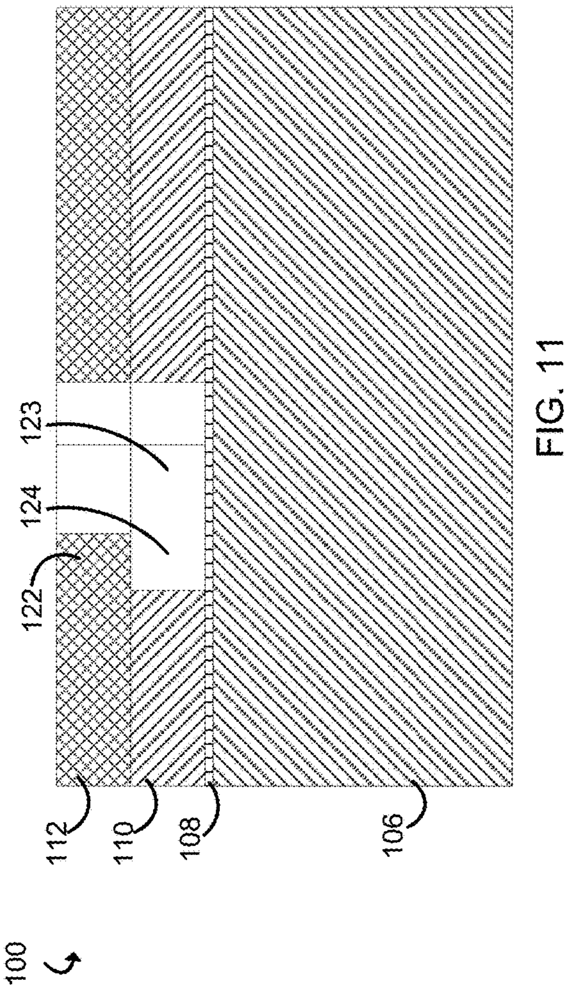
FIG. 11 is a cross-section view of the system of FIG. 10.

In block 310, the photoresist layers 110, 112 are developed, removing the portions of the layers 110, 112 not exposed to sufficient amounts of light (see FIGS. 10 & 11). In the illustrative embodiment, each photoresist layer 110, 112 can be developed with the same process. In some embodiments, the high-sensitivity layer 112 may be developed with one process, and then the low-sensitivity layer 110 may be developed with a second process. After removing the unexposed portions of the photoresist layers 110, 112, the photoresist layers 110, 112 form a mold around where the conductive trace 102 and vias 104 will be. The mold defines a conductive trace region 123 that corresponds to where the conductive trace 102 will be, and the mold defines a via region 124 that corresponds to where the via 104 will be. The top high-sensitivity photoresist layer 112 has an overhang region 122 that extends over the via region 124 where the low-sensitivity photoresist layer 110 was removed.

Figure 12:
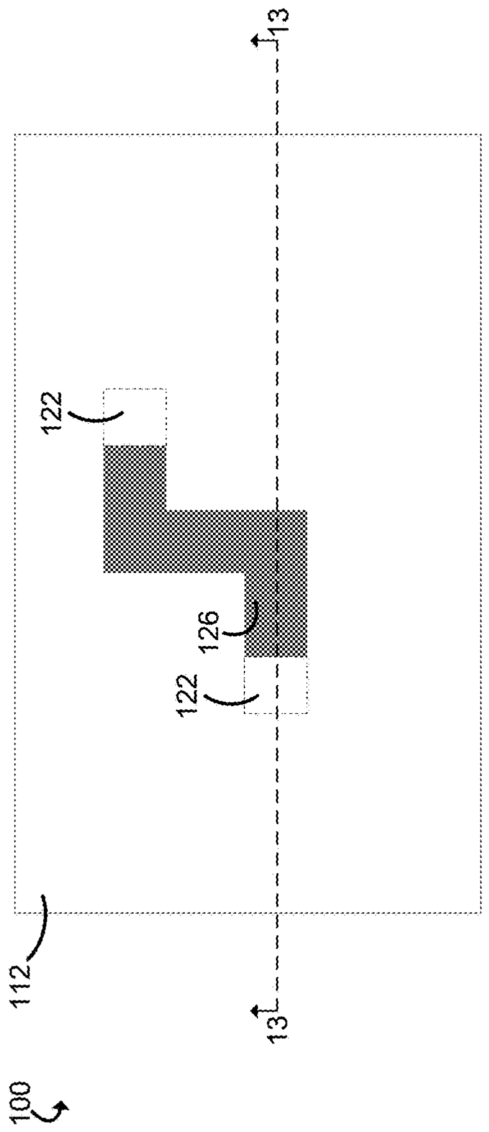
FIG. 12 is a top-down view of a system at one or more steps of the method of FIG. 3.
Figure 13:
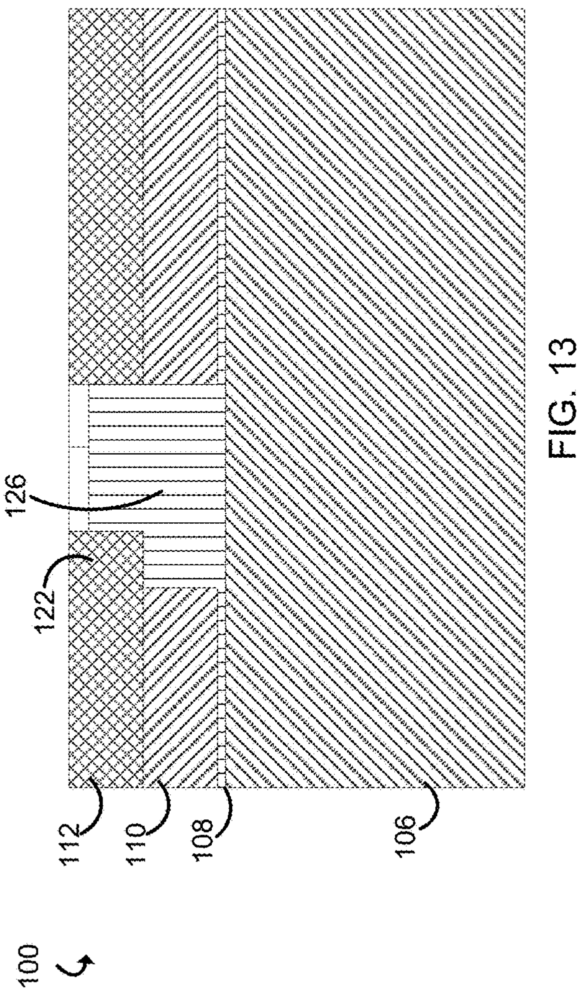
FIG. 13 is a cross-section view of the system of FIG. 12.

In block 312, in the illustrative embodiment, the mold created by the photoresist layers 110, 112 is filled by a conductive infill 126, as shown in FIGS. 12 and 13. In the illustrative embodiment, the conductive infill 126 is copper. In other embodiments, the conductive infill 126 can be another material, such as those that could be used to form the conductive trace 102 and via 104 discussed above. In the illustrative embodiment, the mold is filled using electroplating of copper. In other embodiments, other techniques may be used to deposit the material in the mold, such as electroless plating, sputtering, chemical vapor deposition, atomic layer deposition, etc. In the illustrative embodiment, the conductive infill 126 is applied until it is at least the height of the photoresist layer 110, completely filling the via region 124 up to the overhang region 122.

Figure 14:
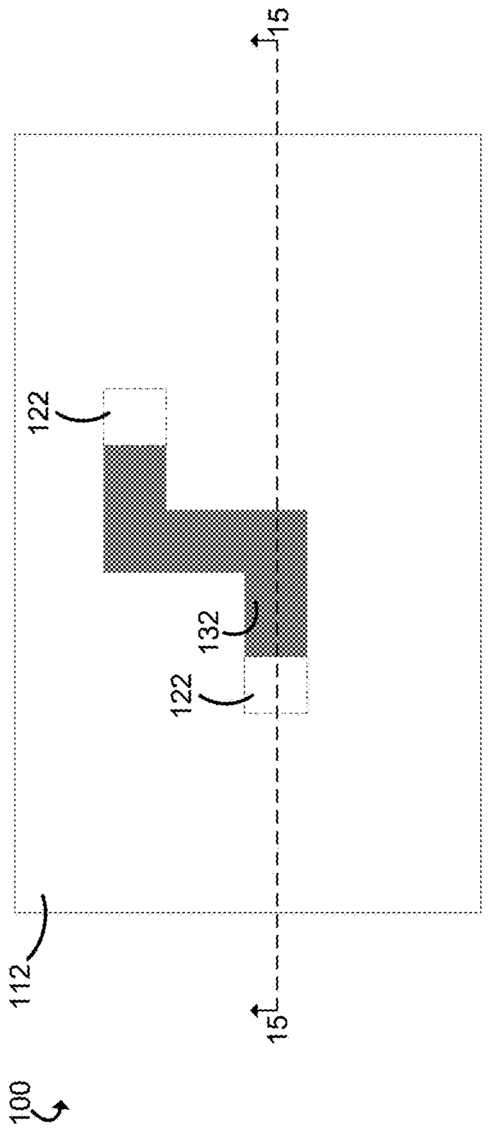
FIG. 14 is a top-down view of a system at one or more steps of the method of FIG. 3.
Figure 15:
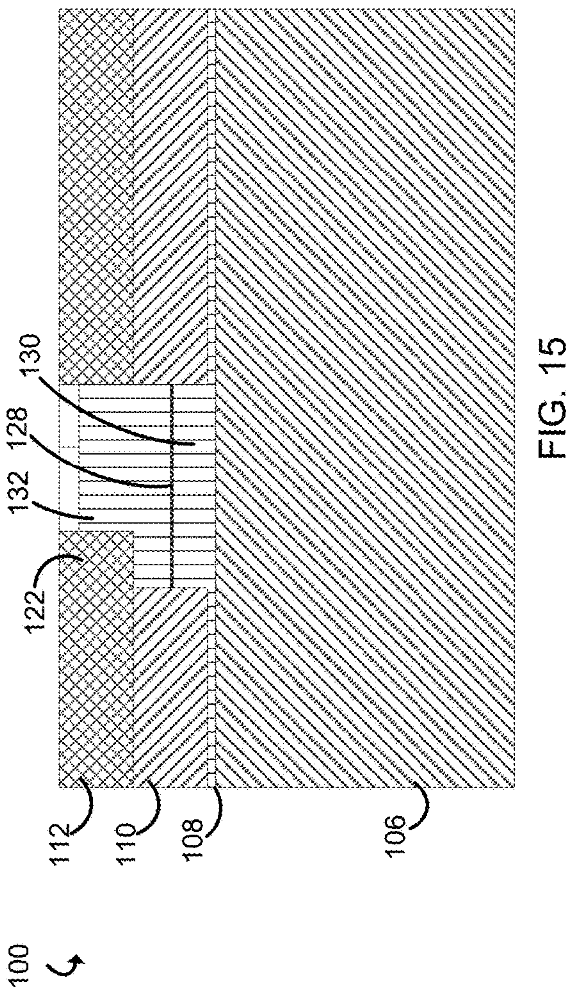
FIG. 15 is a cross-section view of the system of FIG. 14.

In some embodiments, in block 314, an etch stop layer 128 is added after a first conductive infill 130 is added (see FIGS. 14 & 15). A second conductive infill 132 is added on top of the etch stop layer 128. The etch stop layer 128 is made of a material that will not be etched when the second conductive infill 132 is etched in block 316 (or will be etched more slowly than the second conductive infill 132), thus stopping the first conductive infill 130 from being etched. The etch stop layer 128 may be used to more precisely control the height of the conductive traces 102. The etch stop layer 128 may be any suitable material that is etched more slowly than the second conductive infill 132. For example, if the second conductive infill 132 is copper, the etch stop layer 128 may be made of nickel, titanium, tungsten, etc. The etch stop layer 128 may be applied in any suitable manner, such as electroless plating, sputtering, chemical vapor deposition, atomic layer deposition, etc. The etch stop layer 128 may be any suitable thickness, such as 0.05-10 micrometers.

Figure 16:
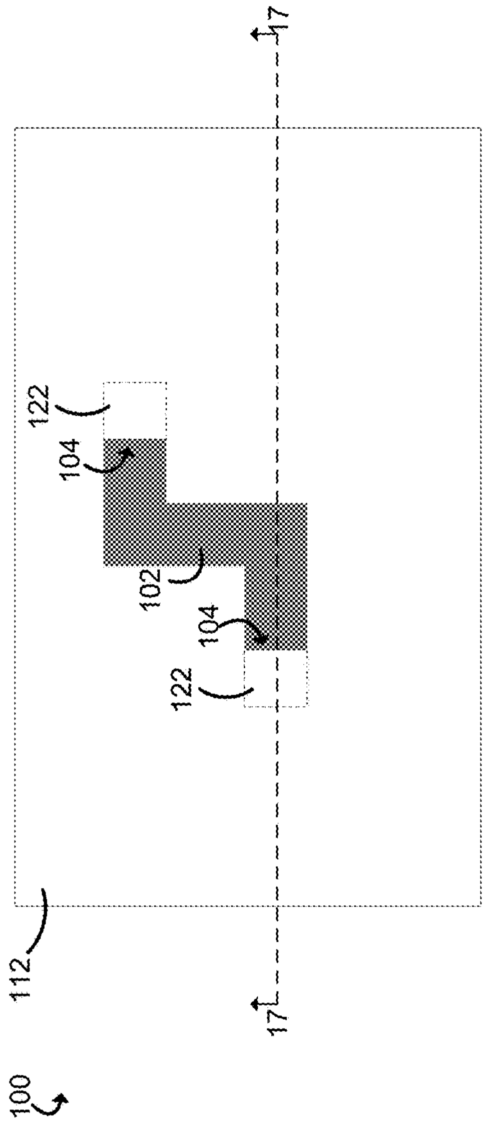
FIG. 16 is a top-down view of a system at one or more steps of the method of FIG. 3.
Figure 17:
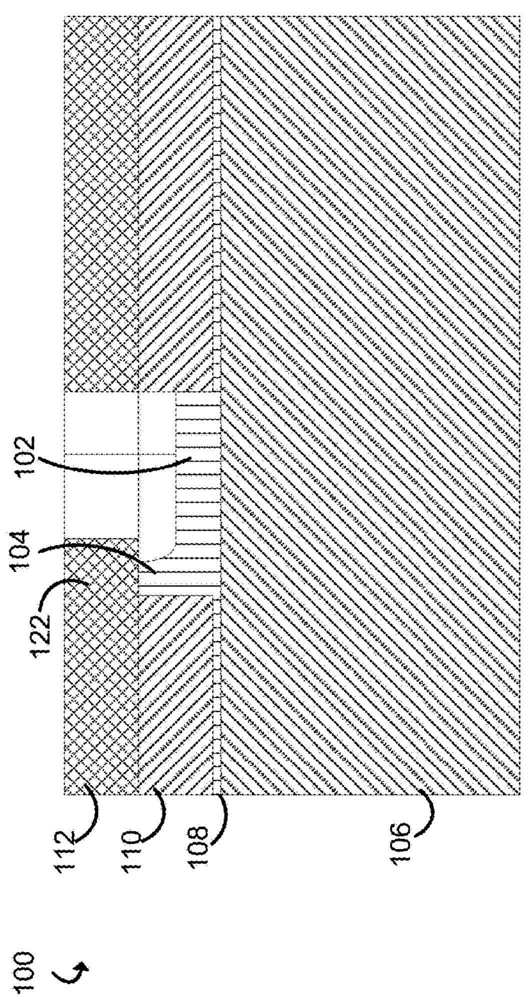
FIG. 17 is a cross-section view of the system of FIG. 16.
Figure 18:
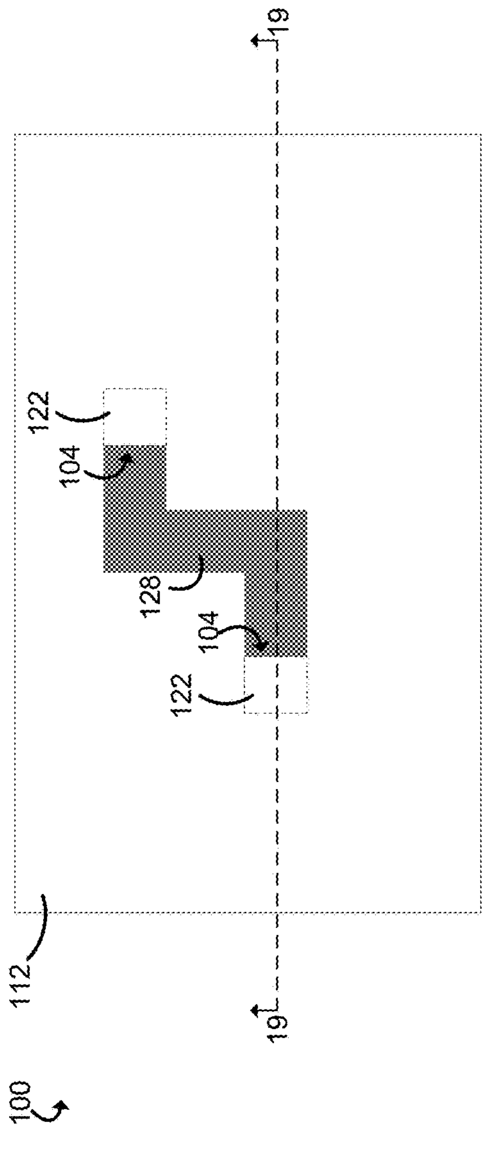
FIG. 18 is a top-down view of a system at one or more steps of the method of FIG. 3.
Figure 19:
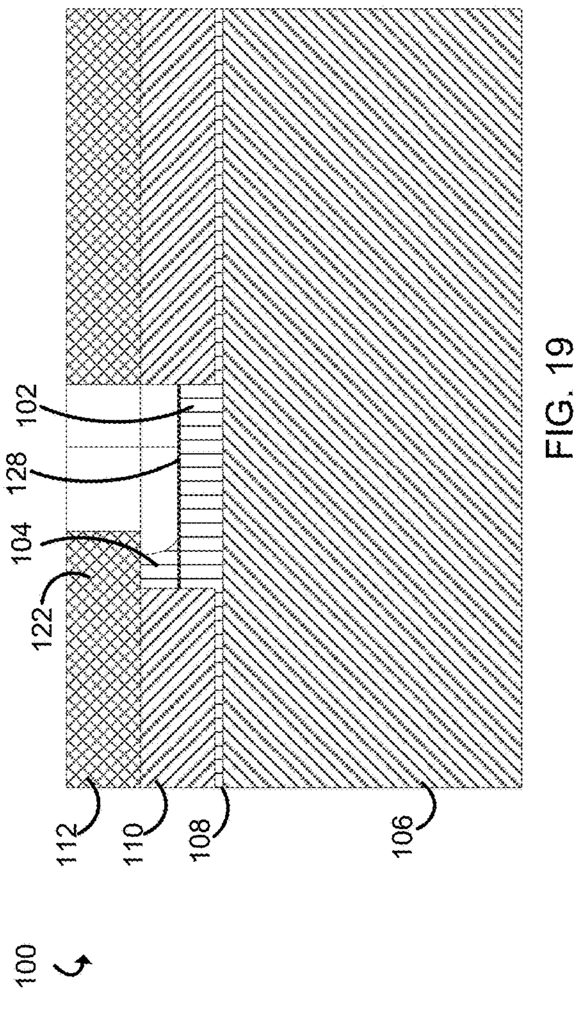
FIG. 19 is a cross-section view of the system of FIG. 18.

In block 316, part of the conductive infill 126 (or second conductive infill 132, in embodiments with an etch stop layer 128) is etched away using an etchant, as shown in FIGS. 16 and 17 (or FIGS. 18 and 19, in embodiments with an etch stop layer 128). In the illustrative embodiment, an isotropic wet etching process is used. The conductive infill 126 is etched down from the top surface of the conductive infill 126 until the conductive infill 126 corresponding to the conductive trace 102 is at a desired height. The "top surface" of the conductive infill 126 refers to the surface that is opposite a bottom surface of the conductive infill 126 that is in contact with the substrate 106 on which the conductive infill 126 is grown and does not imply any particular orientation of the system 100. In embodiments with an etch stop layer 128, the second conductive infill 132 is etched until the etch stop layer 128 is reached. In some embodiments, the etch of the second conductive infill 132 may be stopped before the etch stop layer 128 is reached, with the etch stop layer 128 providing a backstop in case of over-etching due to, e.g., process fluctuations. As a result, the etch stop layer 128 will remain on the surface of the conductive trace 102 that is formed. However, as part of the via 104 is above the etch stop layer 128, the etch stop layer will bisect the via 104, splitting into two parts. In some embodiments, the etch stop layer 128 is removed above the conductive trace 102.

Because the overhang region 122 stops the etchant from reaching the top surface of the infill 126 that is directly under the overhang region 122, the conductive infill 126 under the overhang region 122 is laterally etched as the conductive infill 122 in the conductive trace region 123 is etched downward, creating a pillar or column with a scalloped or concave profile, as shown in FIG. 17. Because the etching is stopped before the part of the infill 126 under the overhang region 122 is fully etched, the etched infill 126 forms both the conductive trace 102 and the vias 104. Because the infill 126 forms both the conductive trace 102 and the vias 104 as outlined by the photoresist layers 110, 112, the vias 104 are automatically aligned to the conductive trace 102. In contrast to the scalloped profile of the via 104 shown in FIG. 17, the profile of a cross-section of the conductive traces 102 and/or the profile a cross-section of the via 104 orthogonal to the conductive traces 102 may be tapered due to the photolithography process.

In the illustrative embodiment, chemical etching is used to etch the infill 126. In other embodiments, other etching techniques may be used, such as reactive ion etching. Use of techniques such as reactive ion etching may change the final shape of the via 104 as little to no material may be removed under the overhang region 122.

The photoresist layers 110, 112, can then be removed in block 318, and the seed layer 108 can be removed in block 320, leaving the conductive traces 102 and the vias 104 on the substrate 106, as shown in FIGS. 1 and 2. In embodiments with an etch stop layer 128, the etch stop layer 128 may remain on top of the conductive traces 102.

After removal of the photoresist layers 110, 112 and seed layer 108, other processing may be performed on the system 100, such as applying an oxide or other insulating layer, performing via reveal, applying a seed layer 108, creating another layer of conductive traces 102 and/or vias 104, cutting a wafer into dies, packaging dies in a package, etc.

Figure 20:
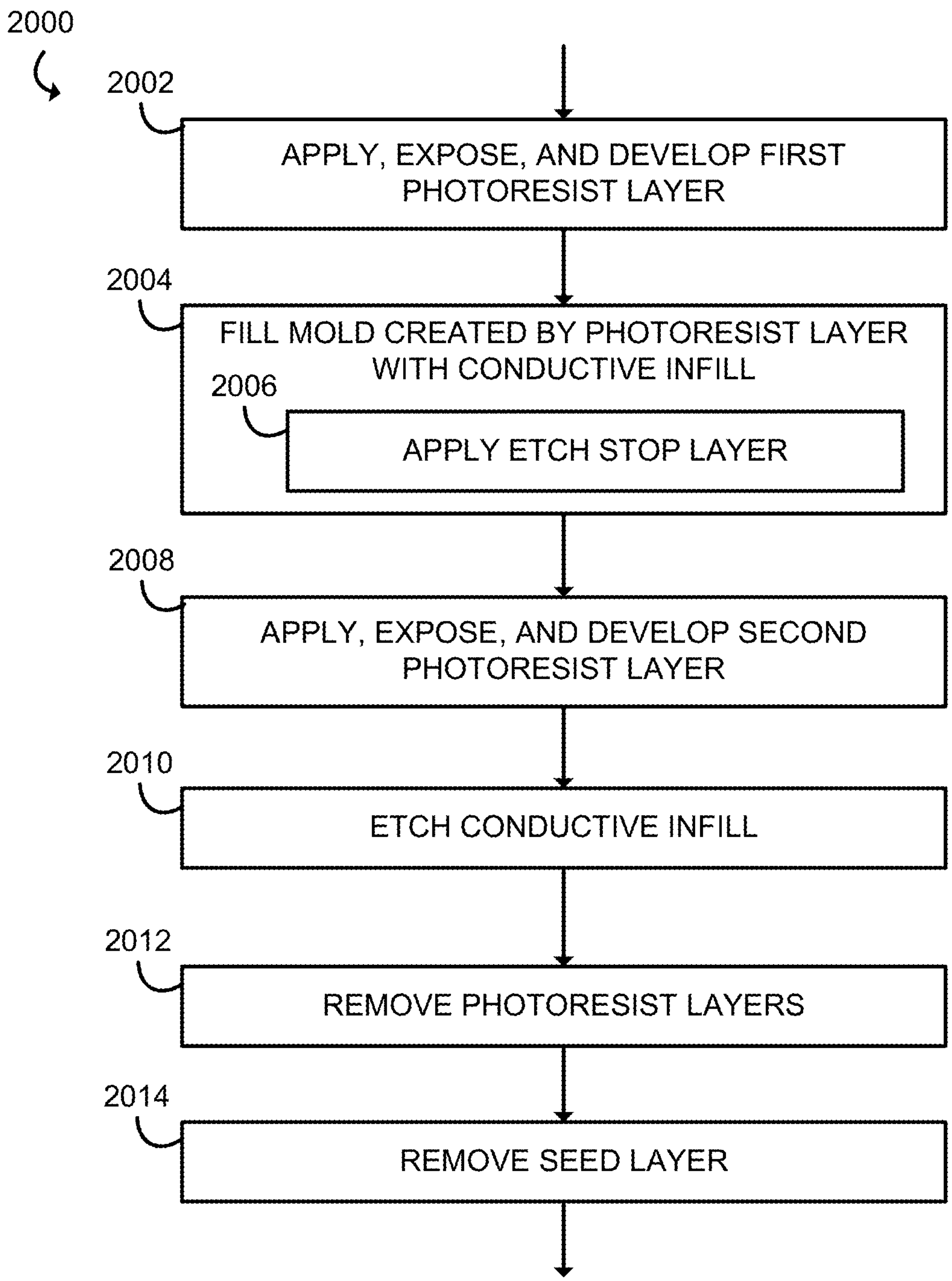
FIG. 20 is a simplified flow diagram of at least one embodiment of a method for creating the conductive trace and via of FIG. 1.

Referring now to FIG. 20, in one embodiment, a method 2000 for creating a low- or zero-misaligned vias, such as the vias 104 shown in FIGS. 1 and 2, is shown. FIGS. 21-46 correspond to different stages of the method 2000. FIGS. 22, 24, 26, 28, 30, 32, 34, 36, 38, 40, 42, 44, and 46 correspond to cross-sections of FIGS. 21, 23, 25, 27, 29, 31, 33, 35, 37, 39, 41, 43, and 45, respectively. The method 2000 begins in block 2002, in which a first photoresist layer 2110 is applied to a seed layer 2108 on a substrate 2106, exposed, and developed. The substrate 2106 and seed layer 2108 may be similar to the substrate 106 and seed layer 108. The first photoresist layer 2110 may be applied, exposed, and developed in a similar manner as the photoresist layers 110, 112. The first photoresist layer 2110 may be similar to the photoresist layers 110, 112, except the first photoresist layer 2110 does not need to be exposed with a multi-tone mask. As such, the first photoresist layer 2110 can be any suitable photoresist material, including high- and low-photosensitivity photoresist.

Figure 21:
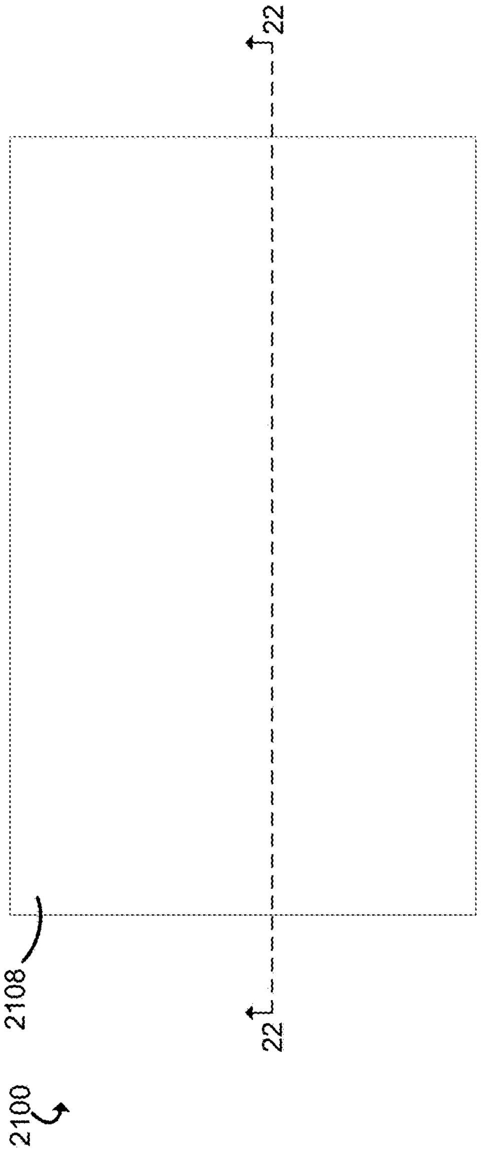
FIG. 21 is a top-down view of a system at one or more steps of the method of FIG. 20.
Figure 22:
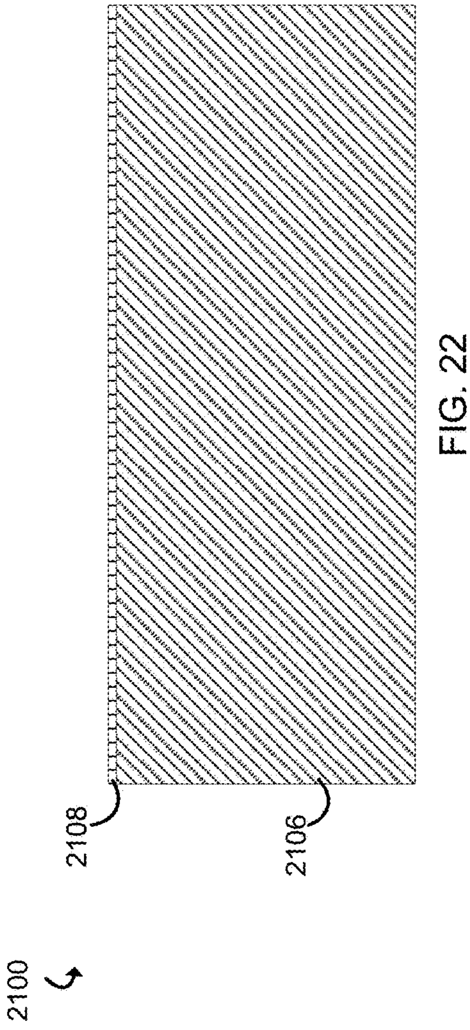
FIG. 22 is a cross-section view of the system of FIG. 21.
Figure 23:
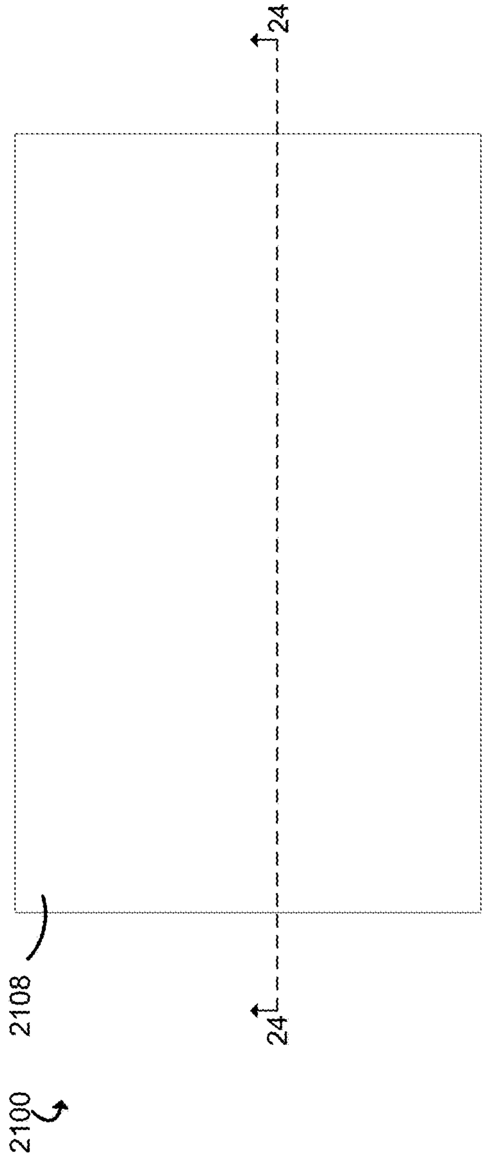
FIG. 23 is a top-down view of a system at one or more steps of the method of FIG. 20.
Figure 24:
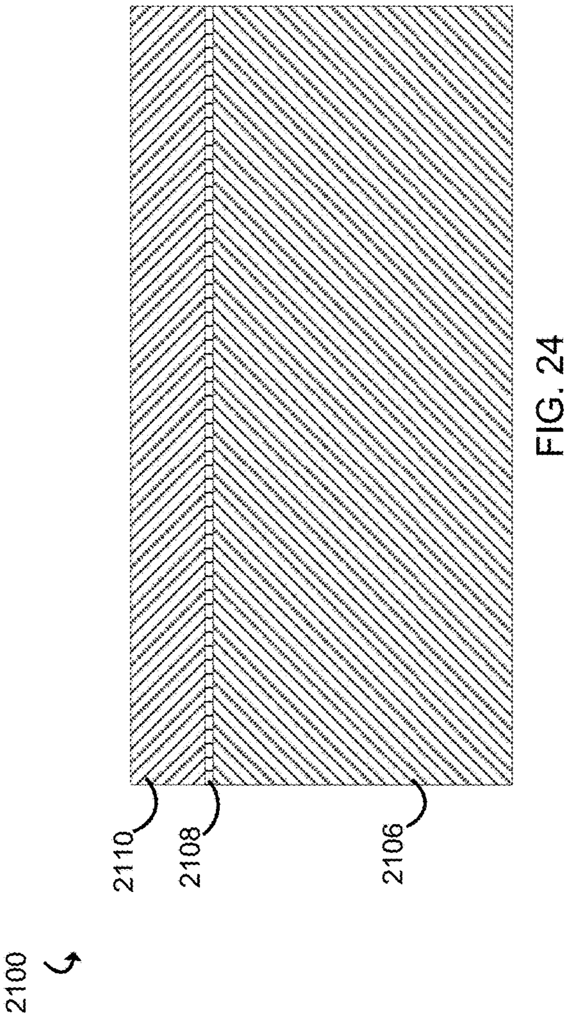
FIG. 24 is a cross-section view of the system of FIG. 23.
Figure 25:
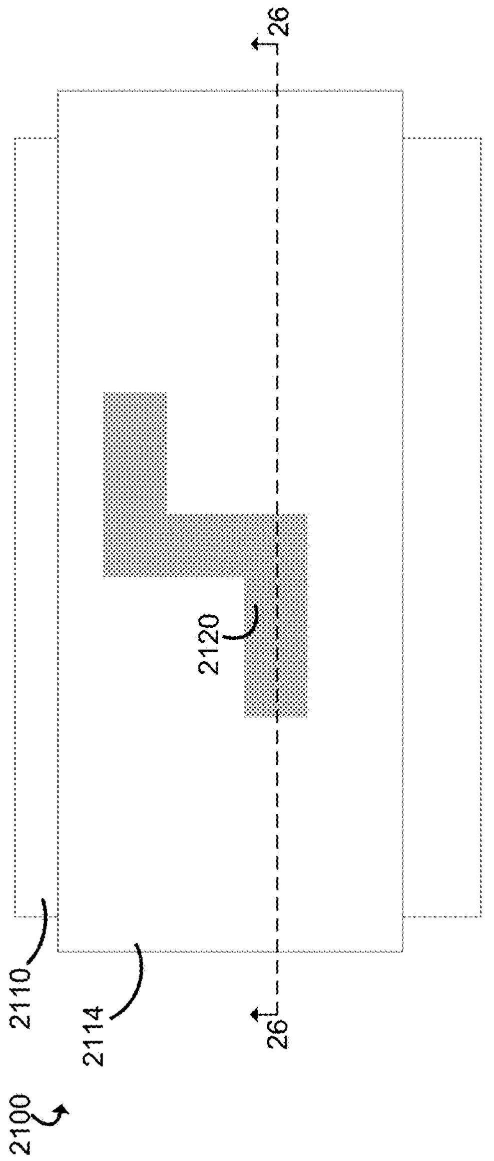
FIG. 25 is a top-down view of a system at one or more steps of the method of FIG. 20.
Figure 26:
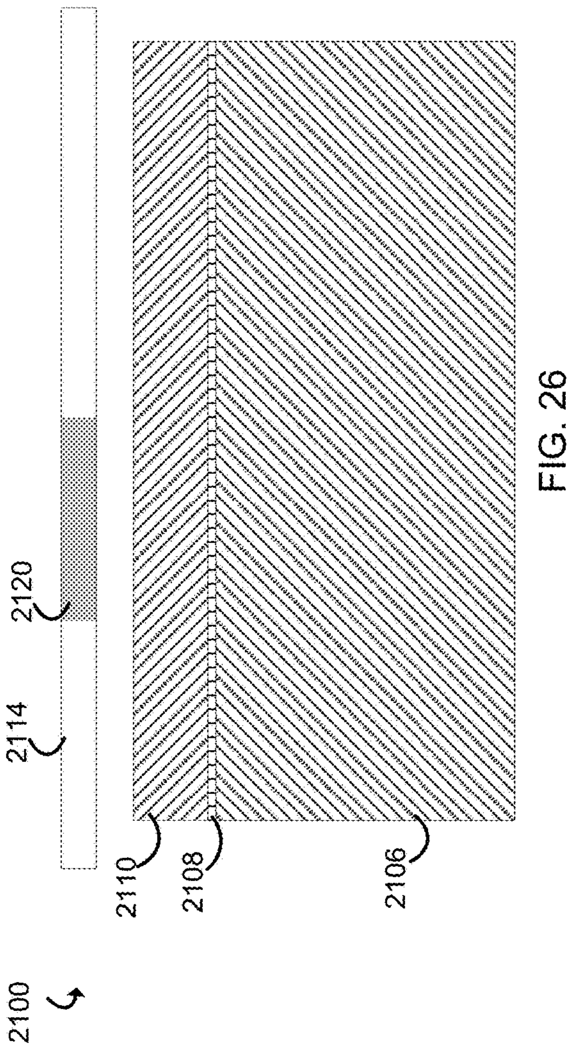
FIG. 26 is a cross-section view of the system of FIG. 25.
Figure 27:
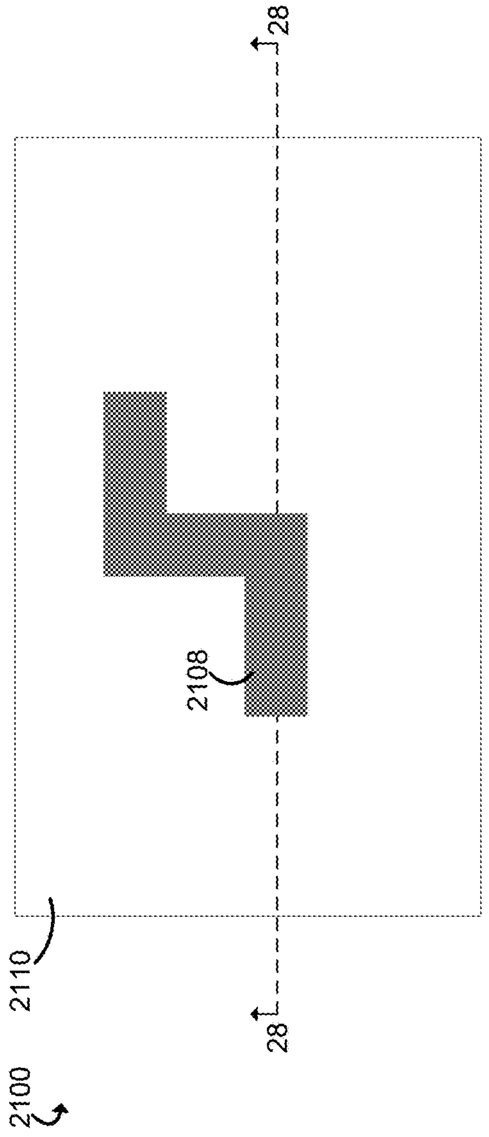
FIG. 27 is a top-down view of a system at one or more steps of the method of FIG. 20.
Figure 28:
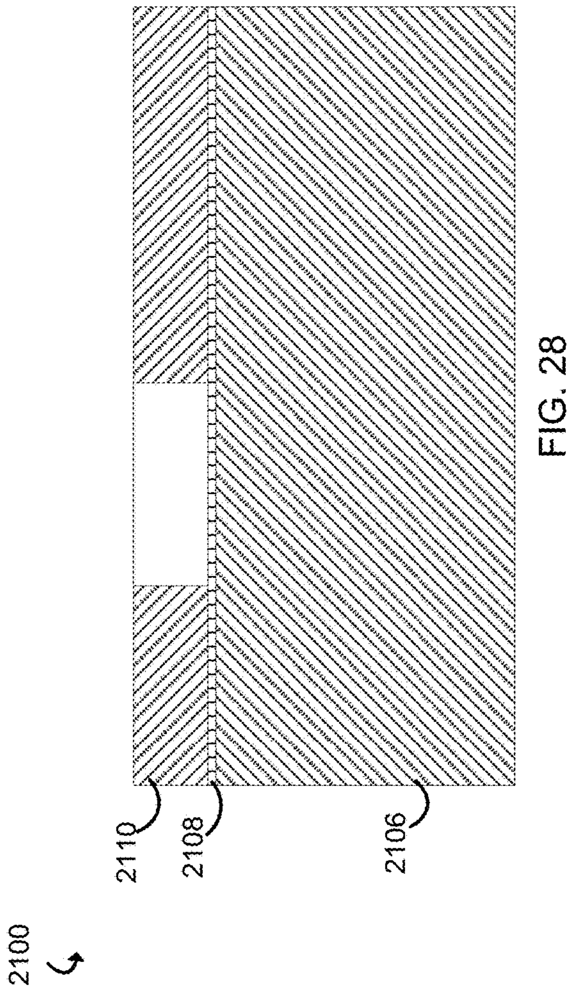
FIG. 28 is a cross-section view of the system of FIG. 27.

FIGS. 21 and 22 show the system 2100 with a substrate 2106 and seed layer 2108. FIGS. 23 and 24 show the first photoresist layer 2110 on the seed layer 2108. FIGS. 25 and 26 show a mask 2114 with a dark region 2120 that defines where the conductive traces 102 and vias 104 will be. FIGS. 27 and 28 show a mold formed by the first photoresist layer 2110.

Figure 29:
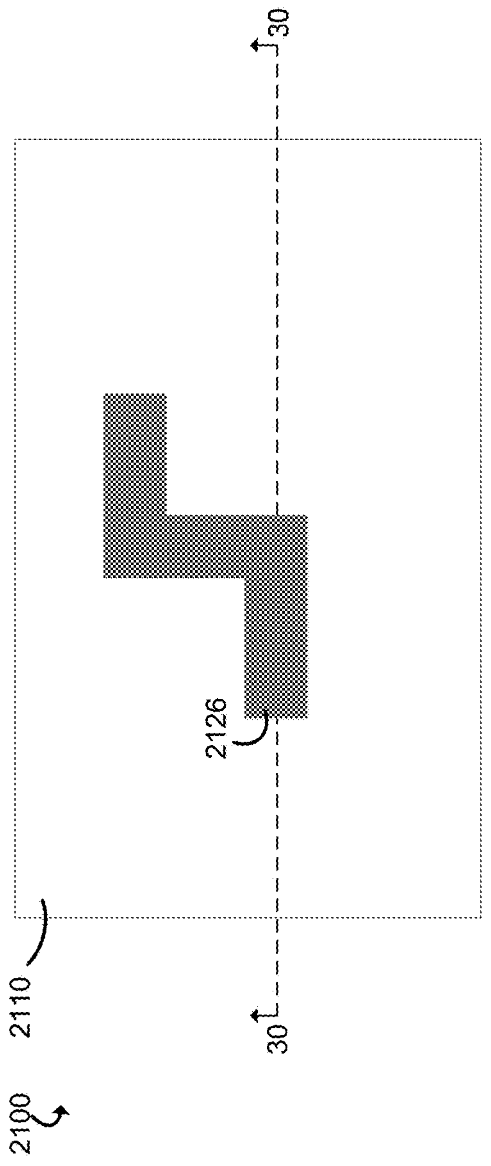
FIG. 29 is a top-down view of a system at one or more steps of the method of FIG. 20.
Figure 30:
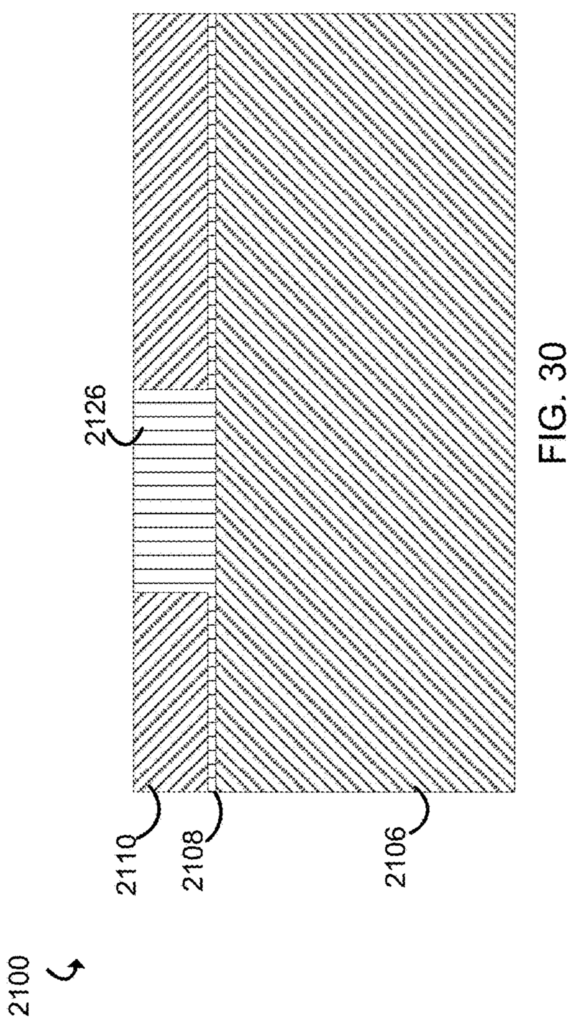
FIG. 30 is a cross-section view of the system of FIG. 29.
Figure 31:
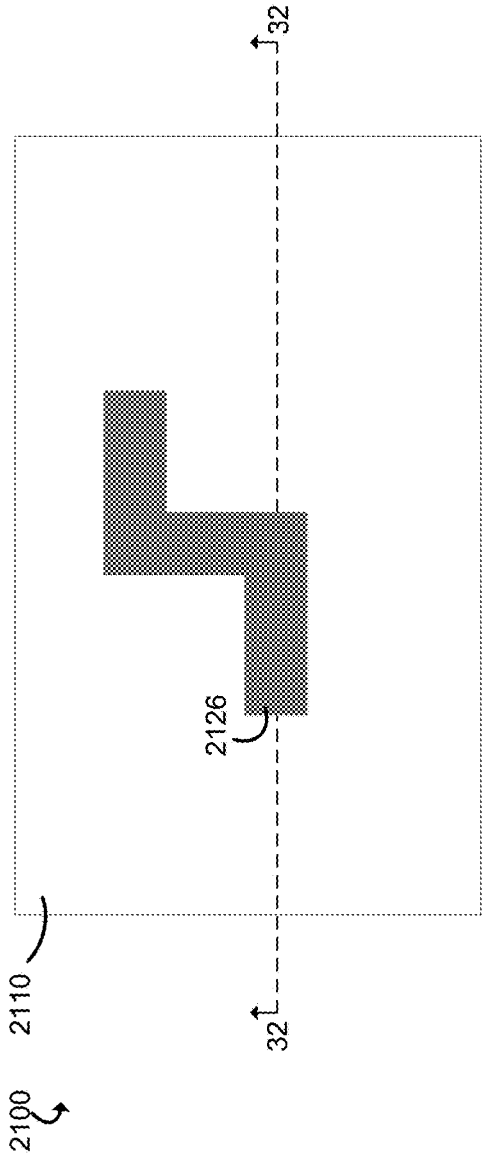
FIG. 31 is a top-down view of a system at one or more steps of the method of FIG. 20.
Figure 32:
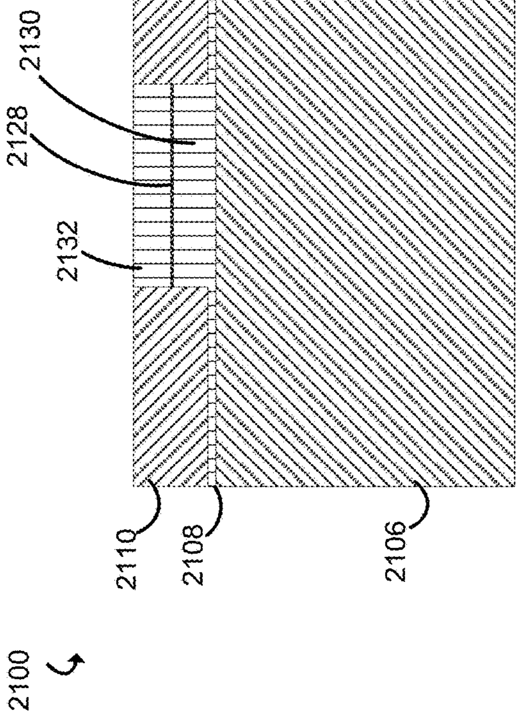
FIG. 32 is a cross-section view of the system of FIG. 31.

In block 2004, the mold created by the first photoresist layer 2110 is filled with a conductor, such as copper, as shown in FIGS. 29 and 30. The mold may be filled in a similar manner as the molds filled in block 312 of the method 300 described above. In some embodiments, in block 2006, an etch stop layer 2128 is added after a first conductive infill 2130 is added (see FIGS. 31 and 32). A second conductive infill 2132 is added on top of the etch stop layer 2128. The etch stop layer 2128 may be similar to the etch stop layer 128 described above.

Figure 33:
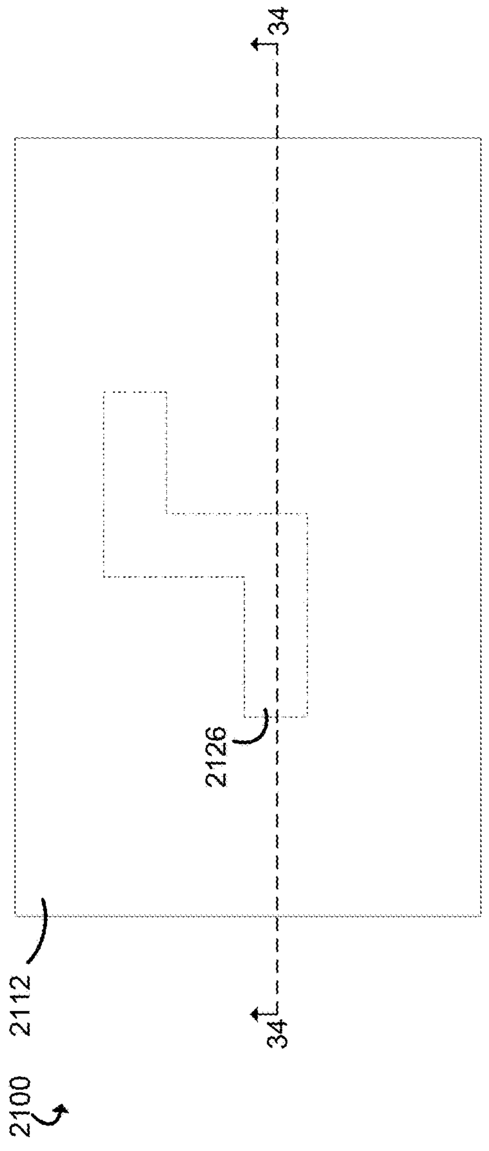
FIG. 33 is a top-down view of a system at one or more steps of the method of FIG. 20.
Figure 34:
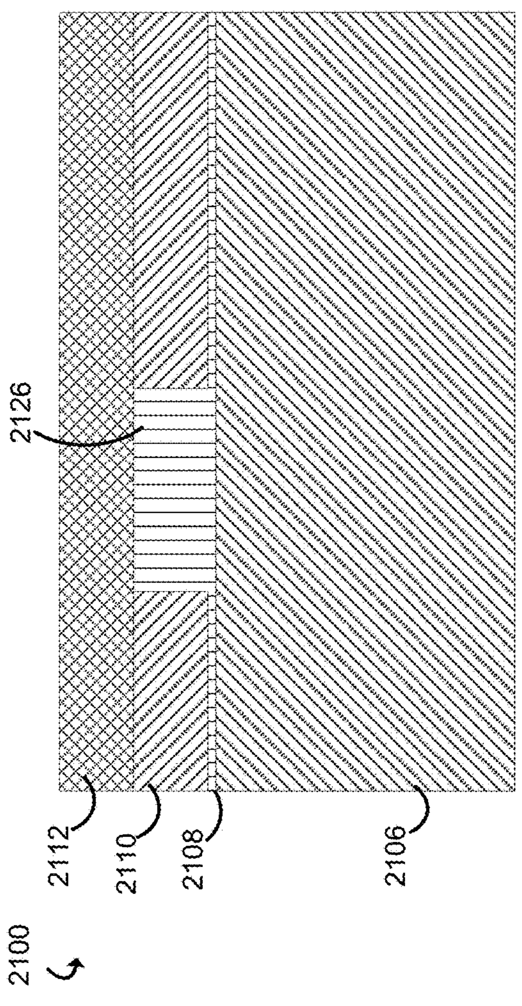
FIG. 34 is a cross-section view of the system of FIG. 33.
Figure 35:
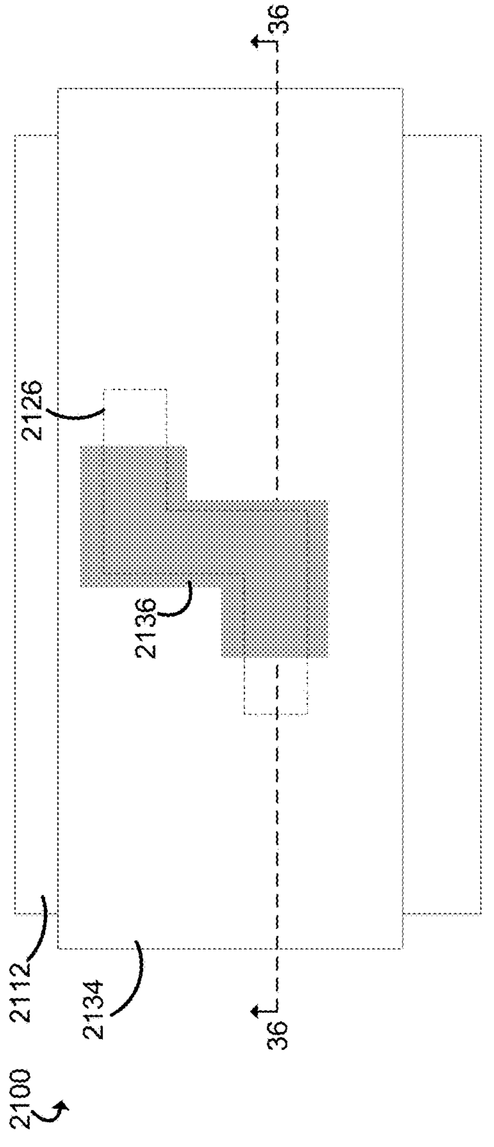
FIG. 35 is a top-down view of a system at one or more steps of the method of FIG. 20.
Figure 36:
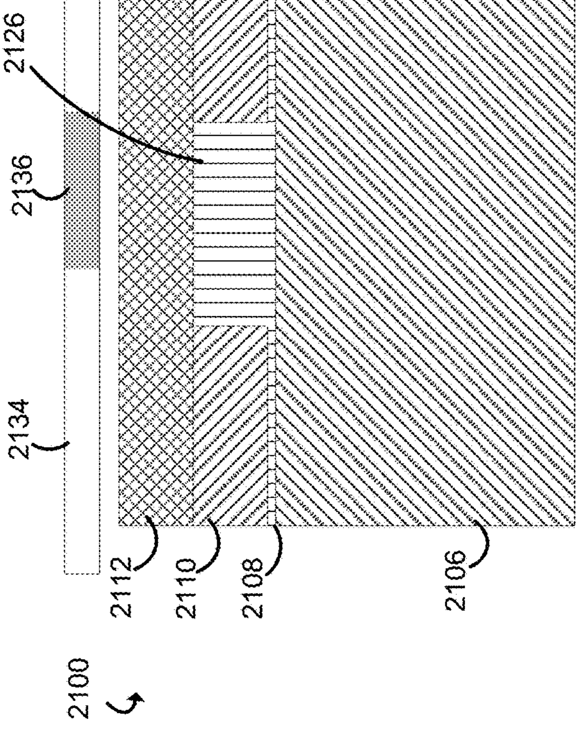
FIG. 36 is a cross-section view of the system of FIG. 35.
Figure 37:
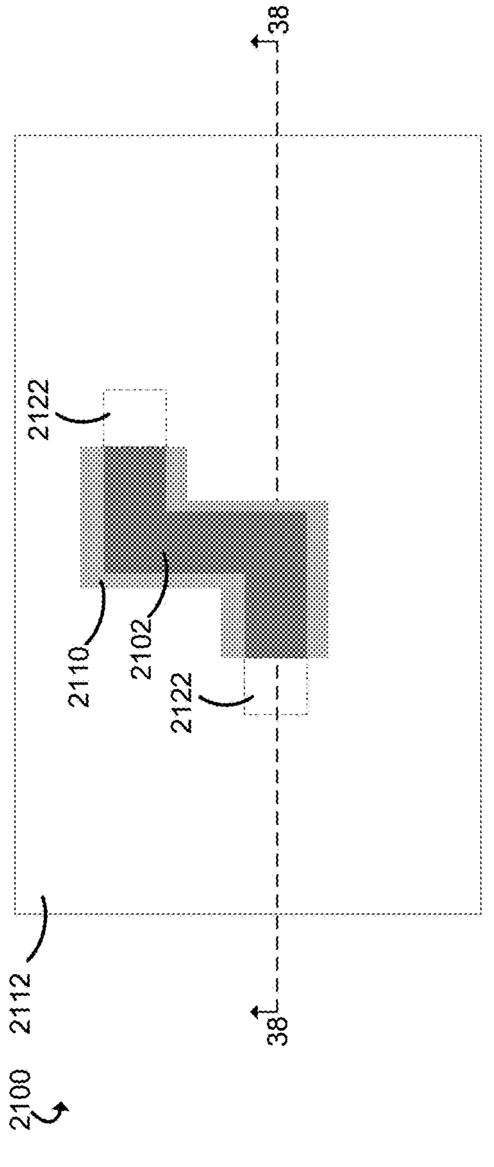
FIG. 37 is a top-down view of a system at one or more steps of the method of FIG. 20.
Figure 38:
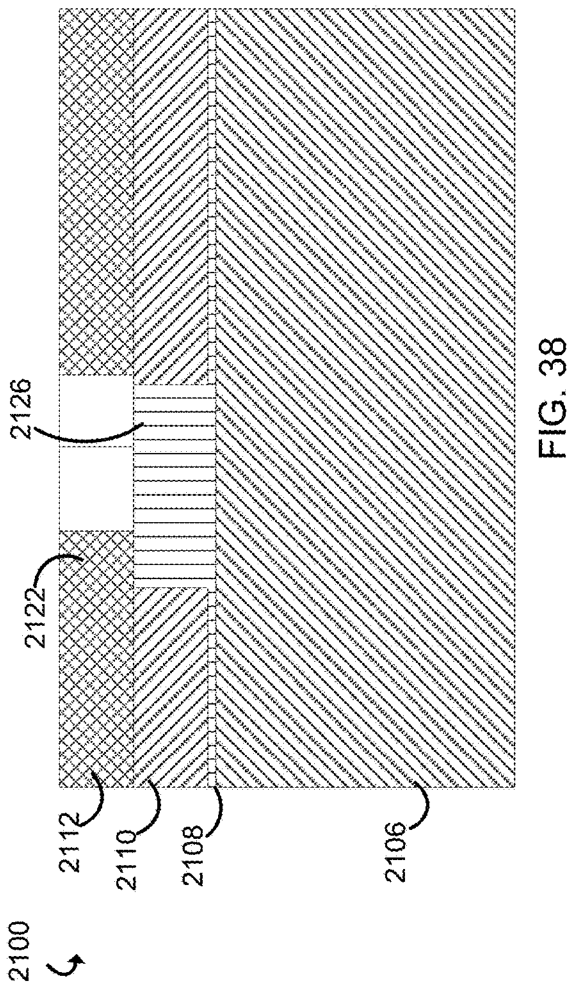
FIG. 38 is a cross-section view of the system of FIG. 37.

In block 2008, a second photoresist layer 2112 is applied over the first photoresist layer 2110 and the infill 2126, and the second photoresist layer 2112 is then exposed and developed. The second photoresist layer 2112 may be similar to the first photoresist layer 2110. FIGS. 33 and 34 show the second photoresist layer 2112 on the first photoresist layer 2110 and the conductive infill 2126. FIGS. 35 and 36 show a mask 2134 with a dark region 2136 that defines where the conductive traces 102 will be. It should be appreciated that the mask 2134 does not cover where the vias 104 will be, creating an overhang 2122 in the second photoresist layer 2112 similar to the overhang region 122, as shown in FIGS. 37 and 38.

Figure 39:
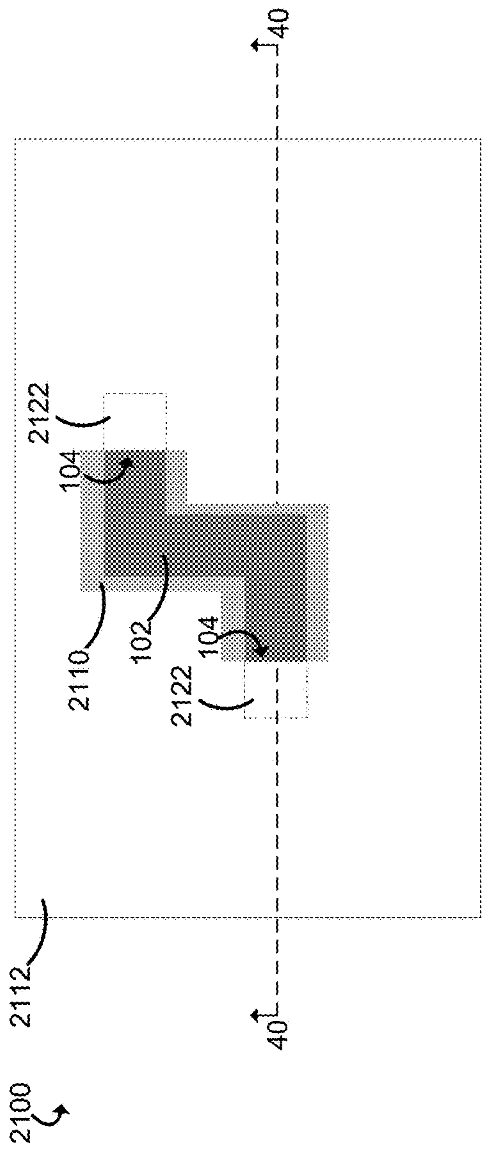
FIG. 39 is a top-down view of a system at one or more steps of the method of FIG. 20.
Figure 40:
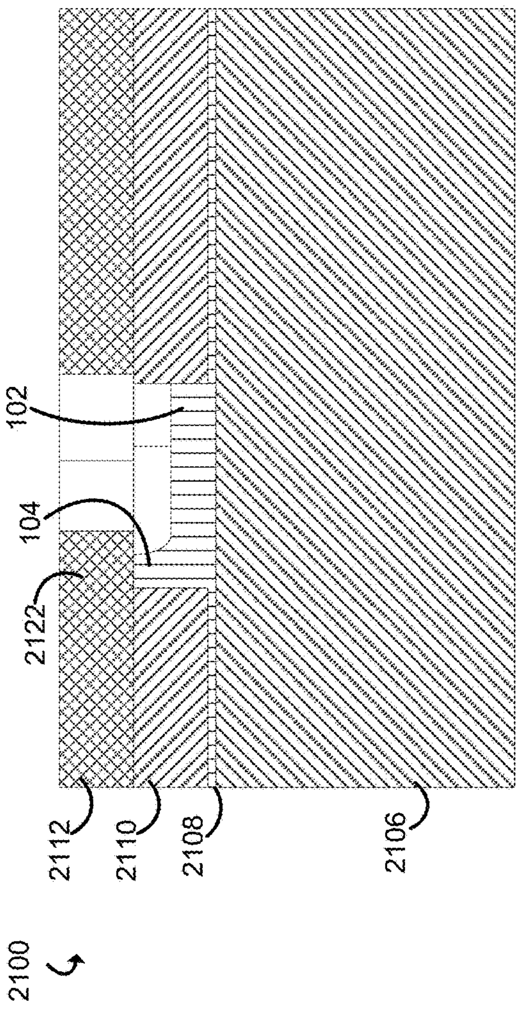
FIG. 40 is a cross-section view of the system of FIG. 39.

In block 2010, part of the conductive infill 2126 is etched away, as shown in FIGS. 39 and 40. The conductive infill 2126 is etched until the conductive infill 2126 corresponding to the conductive trace 102 is at a desired height. Because the overhang region 2122 stops the etchant from reaching the top surface of the infill 2126 that is directly under the overhang region 2122, the conductive infill 126 under the overhang region 122 is laterally etched as the conductive infill 122 in the conductive trace region 123 is etched downward, creating a profile with a concave shape with a narrower region that is distal from the substrate 106 and a broader region proximal the substrate 106, as shown in FIG. 40. Because the etching is stopped before the part of the infill 2126 under the overhang region 2122 is fully etched, the etched infill 2126 forms both the conductive trace 102 and the vias 104.

The photoresist layers 2110, 2112 are then removed in block 2012, and the seed layer 2108 is removed in block 2014, leaving conductive traces 102 and vias 104 on a substrate 2106, similar to the system 100 shown in FIGS. 1 and 2.

In the illustrative embodiment, the dark region 2136 of the mask 2134 shown in FIGS. 35 and 36 has larger dimensions than the infill 2126 underneath it for the parts of the infill 2126 that will form the conductive trace 102. For example, the dark region 2136 may extend 0.1-5 micrometers past the edge of the conductive traces 102. As such, if the mask 2134 is slightly misaligned, then the infill 2126 above the position for the conductive traces 102 will be removed anyway. However, the edge of the dark region 2136 that defines the overhang region 2122 (and also, therefore, defines the vias 104) is not shifted in the same manner as the edges that define the conductive traces 102, as such a shift would change the position of the via 104. It should be appreciated that the dark region 2136 should not extend too close to other traces. For example, it one embodiment, the dark region 2136 may extend no more than approximately (e.g., within 0.5 micrometers) of halfway between the trace 102 and the nearest adjacent trace.

Figure 41:
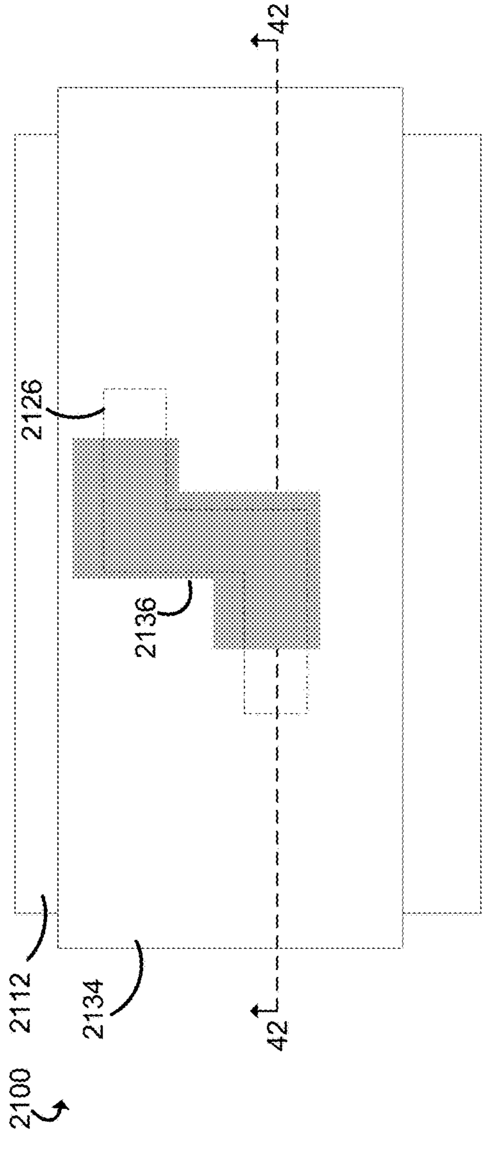
FIG. 41 is a top-down view of a system at one or more steps of the method of FIG. 20.
Figure 42:
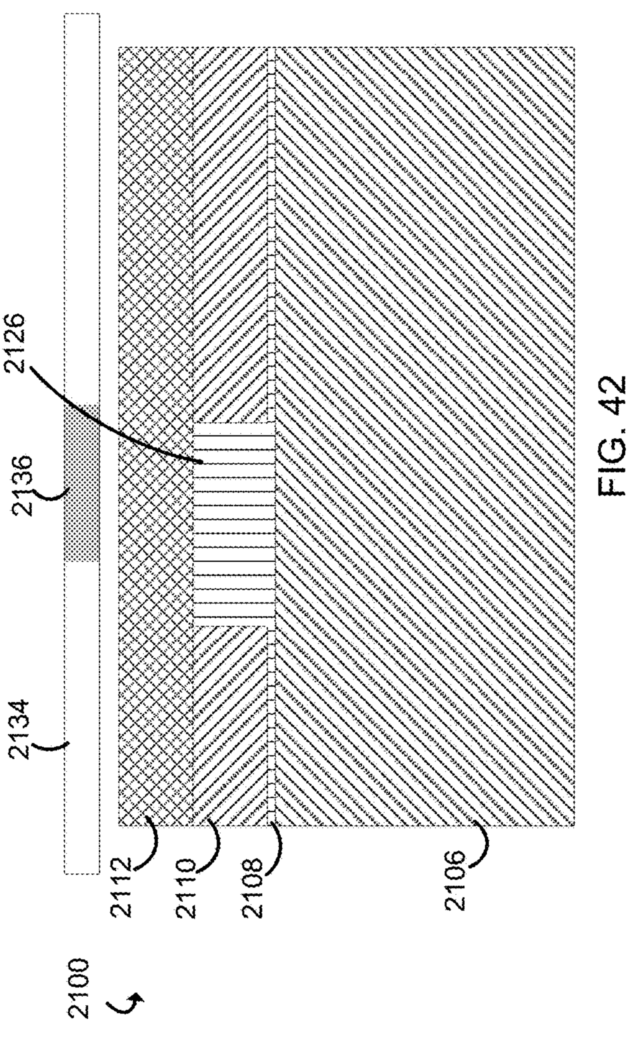
FIG. 42 is a cross-section view of the system of FIG. 41.
Figure 43:
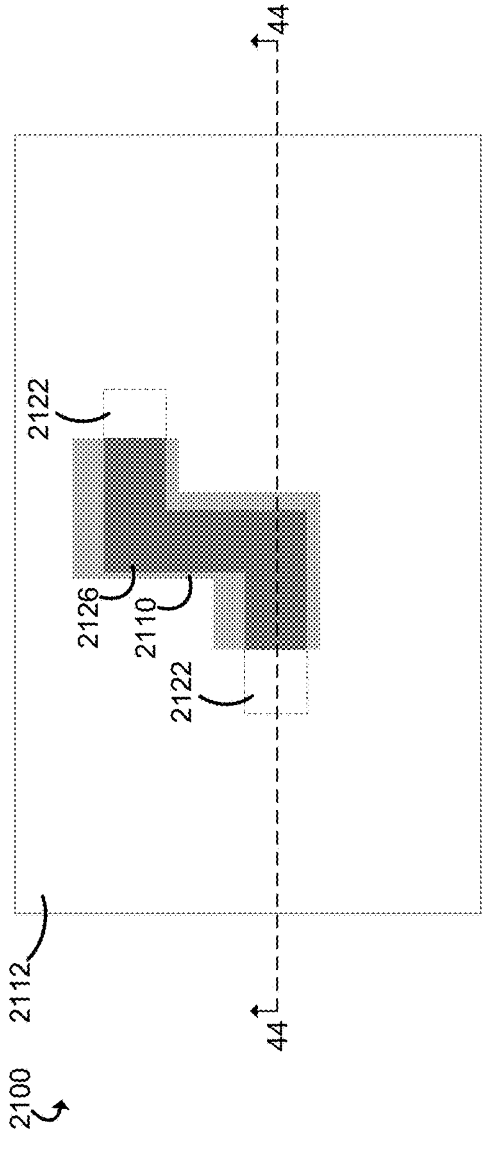
FIG. 43 is a top-down view of a system at one or more steps of the method of FIG. 20.
Figure 44:
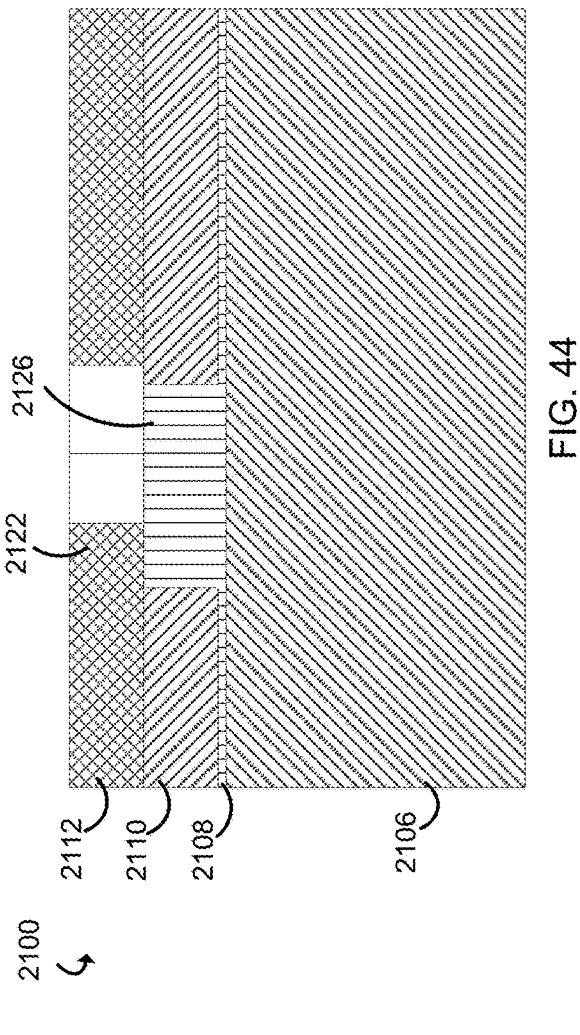
FIG. 44 is a cross-section view of the system of FIG. 43.
Figure 45:
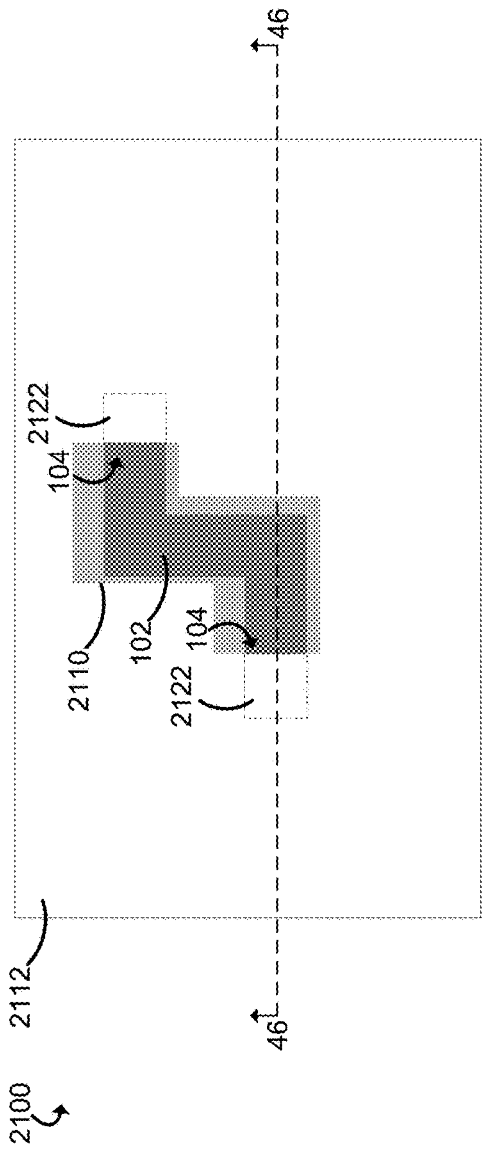
FIG. 45 is a top-down view of a system at one or more steps of the method of FIG. 20.
Figure 46:
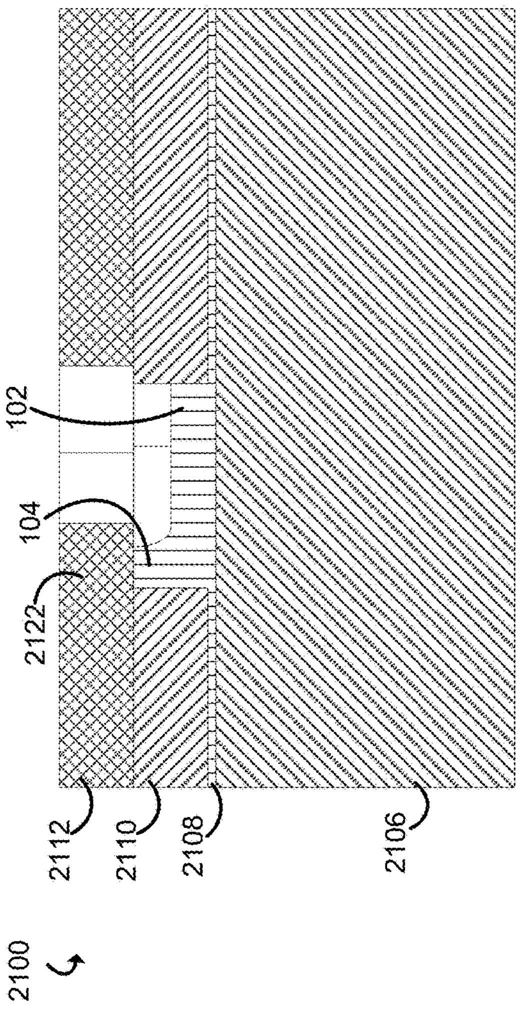
FIG. 46 is a cross-section view of the system of FIG. 45.

For example, referring to FIGS. 41-46, a misaligned mask 2134 is shown in FIGS. 41 and 42. The second mask 2134 is slightly misaligned up and to the right (from the perspective of FIG. 41). After exposure and development, all of the infill 2126 above the conductive trace 102 is visible, except for a small portion near the overhangs 2122. Additionally, part of the first photoresist layer 2110 is visible, which will not affect the etching of the infill 2126.

For the embodiment shown in FIGS. 41-46, the misalignment of the mask 2134 in the up/down direction (from the perspective of FIG. 41) does not cause any misalignment of the vias 104, as the shift of the mask 2134 does not change the position or size of the overhang regions 2122. However, the misalignment of the mask 2134 in the left/right direction (from the perspective of FIG. 41) does cause a change in the resulting vias 104. In particular, a change in the position of the edge of the overhang regions 2122 defines a corresponding change in the location of one edge of the resulting via 104. For example, if the mask 2134 is misaligned by one micrometer in the left/right direction, then one overhang region 2122 will be one micrometer too long and one overhang region 2122 will be one micrometer too short. As a result, one resulting via 104 will be one micrometer too wide, and one resulting via 104 will be one micrometer too narrow.

Figure 47:
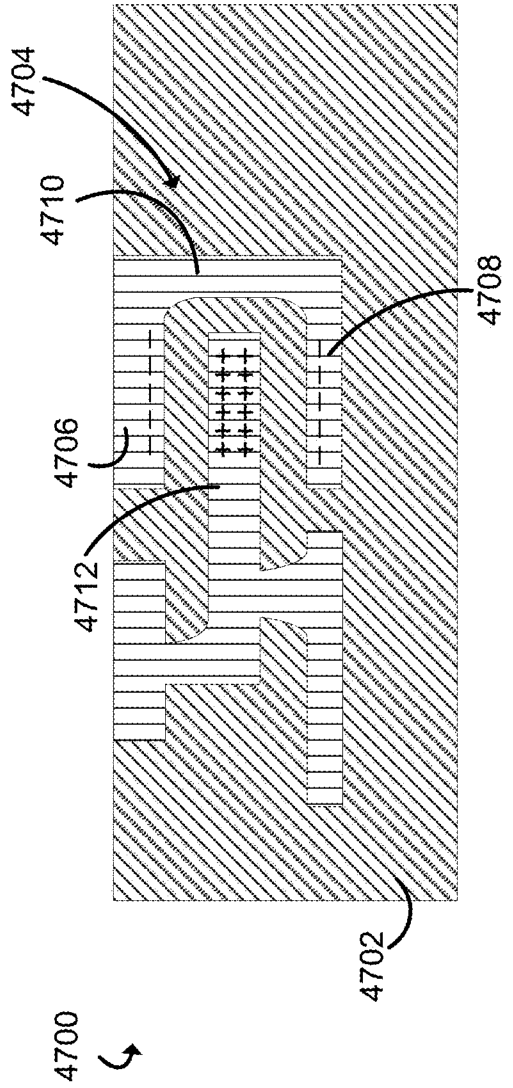
FIG. 47 is a cross-section view of a simplified diagram of a capacitor.

It should be appreciated that the techniques disclosed herein may be used to create any suitable structure. For example, in one embodiment, a system 4700 is shown in FIG. 47. The system 4700 includes a substrate 4702. A capacitor 4704 is formed from an upper conductive trace 4706 of a first plate, a lower conductive trace 4708 of the first plate, a via 4710 connecting the upper conductive trace 4706 and the lower conductive trace 4708, and a conductive trace 4712 of a second plate. Each of the upper conductive trace 4706, the lower conductive trace 4708, the via 4710, and/or the conductive trace 4712 may be relatively wide, giving a relatively large capacitance for the capacitor. Each of the upper conductive trace 4706, the lower conductive trace 4708, the via 4710, and/or the conductive trace 4712 may be formed using the techniques disclosed herein. Each of the upper conductive trace 4706, the lower conductive trace 4708, the via 4710, and/or the conductive trace 4712 may be connected to other traces, components, voltage sources, etc.

Figures 48, 49, 50:
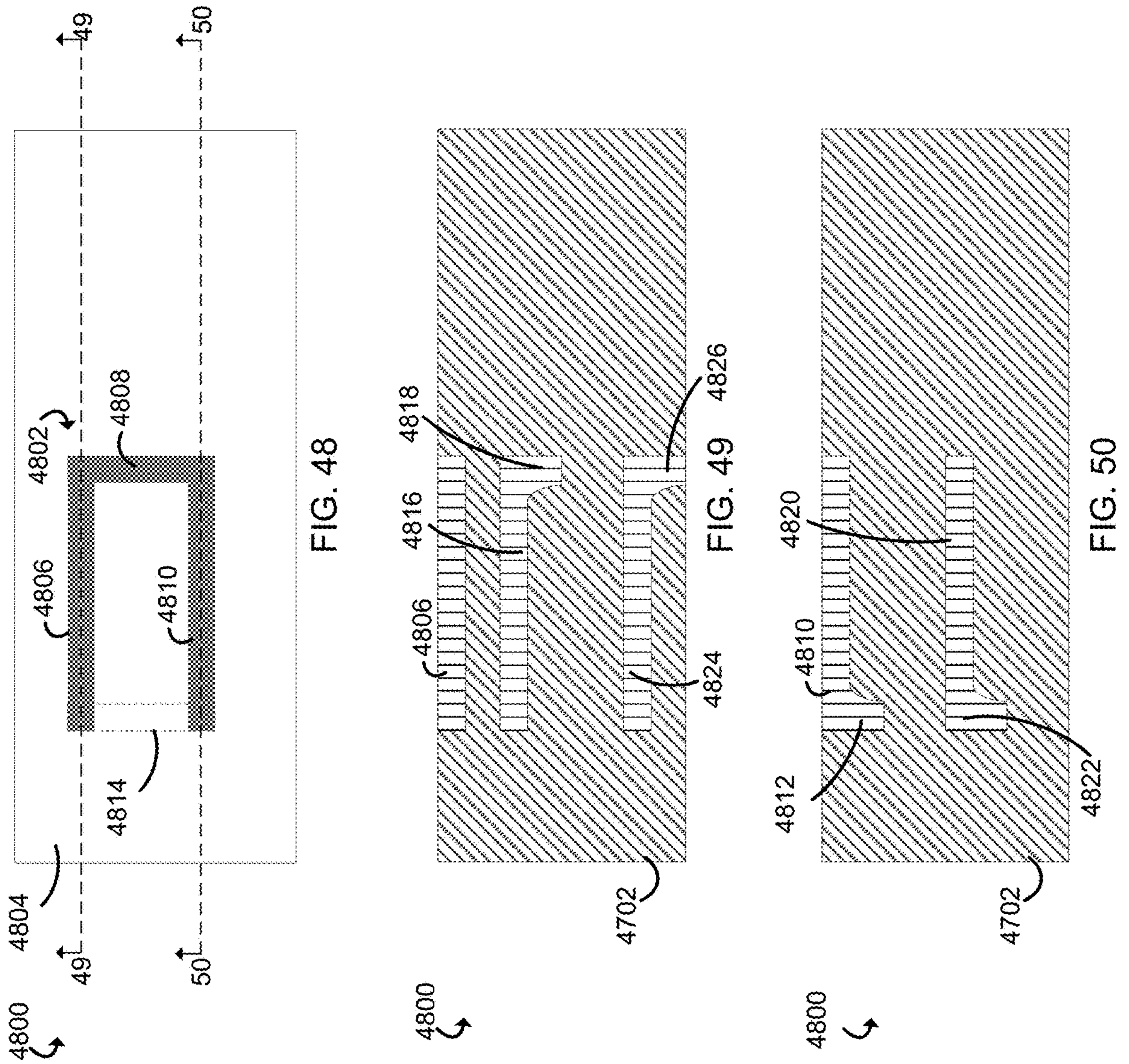
FIG. 48 is a top-down view of a simplified diagram of an inductor.
FIG. 49 is a cross-section view of a simplified diagram of the inductor of FIG. 48.
FIG. 50 is a cross-section view of a simplified diagram of the inductor of FIG. 48.

As another example, in one embodiment, a system 4800 including an inductor 4802 on a substrate 4804 is shown in FIGS. 48-50. The inductor 4802 includes several traces and vias arranged roughly in a spiral shape to concentrate magnetic flux inside the spiral. A current path for the inductor 4802 is from conductive traces 4806, 4808, and 4810 at a first layer of the system 4800. The current path then passes through a via 4812 to a second layer, and then it passes through a conductive trace 4814 and 4816 to another via 4818 to pass to a third layer. The current path then passes through another conductive trace (not visible in FIGS. 48-50) from via 4818 to conductive trace 4820. The current path passes through via 4822 to a fourth layer. The current path passes through a conductive trace (not visible in FIGS. 48-50) from via 4822 to conductive trace 4824. The current path passes through another via 4826 to a fifth layer.

The system 4800 may include other components not shown, such as other traces connected to the inductor 4802. The inductor 4802 may have any suitable number of layers, any suitable number of turns, or any suitable inductance.

Figure 51:
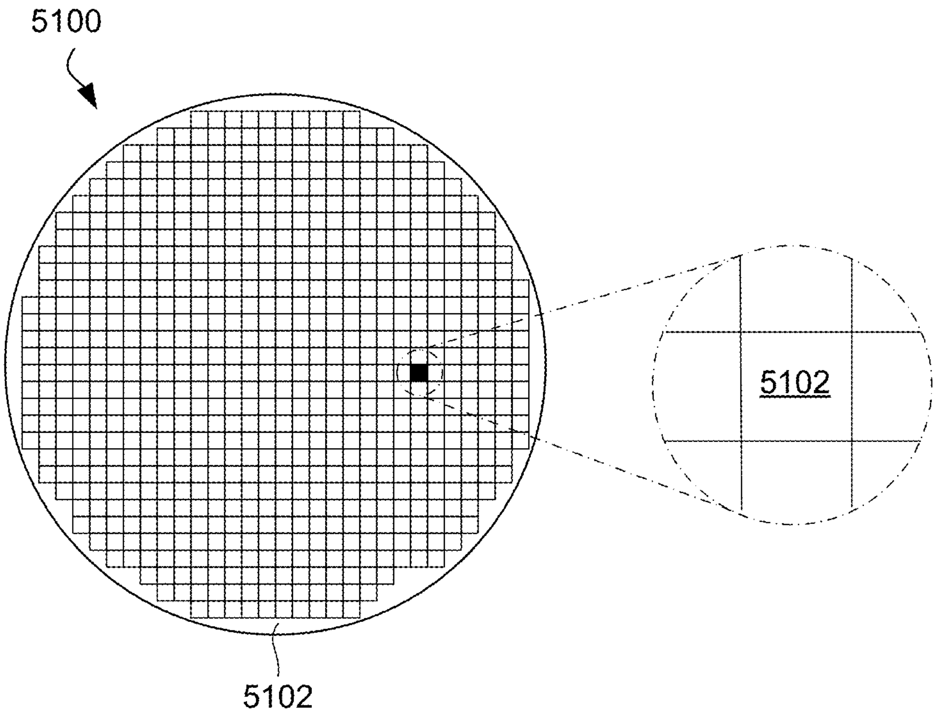
FIG. 51 is a top view of a wafer and dies that may be included in a microelectronic assembly, in accordance with any of the embodiments disclosed herein.

FIG. 51 is a top view of a wafer 5100 and dies 5102 that may be included in any of the systems 100 disclosed herein. The wafer 5100 may be composed of semiconductor material and may include one or more dies 5102 having integrated circuit structures formed on a surface of the wafer 5100. The individual dies 5102 may be a repeating unit of an integrated circuit product that includes any suitable integrated circuit. After the fabrication of the semiconductor product is complete, the wafer 5100 may undergo a singulation process in which the dies 5102 are separated from one another to provide discrete "chips" of the integrated circuit product. The die 5102 may be embodied as part or include some or all of the substrate 106. The die 5102 may include one or more transistors (e.g., some of the transistors 5240 of FIG. 52, discussed below), supporting circuitry to route electrical signals to the transistors, passive components (e.g., signal traces, resistors, capacitors, or inductors), and/or any other integrated circuit components. In some embodiments, the wafer 5100 or the die 5102 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 5102. For example, a memory array formed by multiple memory devices may be formed on a same die 5102 as a processor unit (e.g., the processor unit 5402 of FIG. 54) or other logic that is configured to store information in the memory devices or execute instructions stored in the memory array. Various ones of the system 100 disclosed herein may be manufactured using a die-to-wafer assembly technique in which some dies of the system 100 are attached to a wafer 5100 that include others of dies of the system 100, and the wafer 5100 is subsequently singulated.

Figure 52:
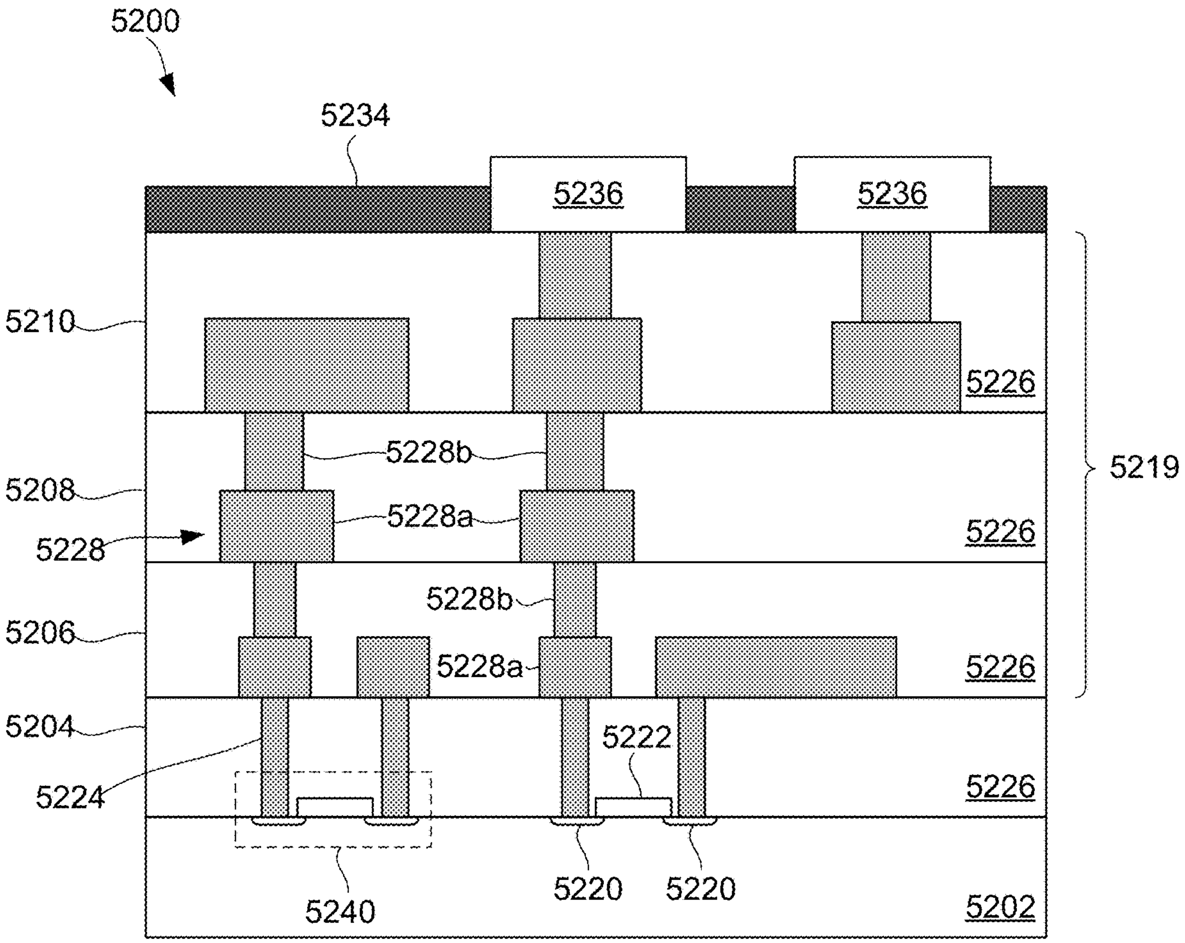
FIG. 52 is a cross-sectional side view of an integrated circuit device that may be included in a microelectronic assembly, in accordance with any of the embodiments disclosed herein.

FIG. 52 is a cross-sectional side view of an integrated circuit device 5200 that may be included in any of the systems 100 disclosed herein (e.g., in any of the substrates 106). One or more of the integrated circuit devices 5200 may be included in one or more dies 5102 (FIG. 51).

The integrated circuit device 5200 may be formed on a die substrate 5202 (e.g., the wafer 5100 of FIG. 51) and may be included in a die (e.g., the die 5102 of FIG. 51). The die substrate 5202 may be a semiconductor substrate composed of semiconductor material systems including, for example, n-type or p-type materials systems (or a combination of both). The die substrate 5202 may include, for example, a crystalline substrate formed using a bulk silicon or a silicon-on-insulator (SOI) substructure. In some embodiments, the die substrate 5202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 5202. Although a few examples of materials from which the die substrate 5202 may be formed are described here, any material that may serve as a foundation for an integrated circuit device 5200 may be used. The die substrate 5202 may be part of a singulated die (e.g., the dies 5102 of FIG. 51) or a wafer (e.g., the wafer 5100 of FIG. 51).

The integrated circuit device 5200 may include one or more device layers 5204 disposed on the die substrate 5202. The device layer 5204 may include features of one or more transistors 5240 (e.g., metal oxide semiconductor field-effect transistors (MOSFETs)) formed on the die substrate 5202. The transistors 5240 may include, for example, one or more source and/or drain (S/D) regions 5220, a gate 5222 to control current flow between the S/D regions 5220, and one or more S/D contacts 5224 to route electrical signals to/from the S/D regions 5220. The transistors 5240 may include additional features not depicted for the sake of clarity, such as device isolation regions, gate contacts, and the like. The transistors 5240 are not limited to the type and configuration depicted in FIG. 52 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 5240 may include a gate 5222 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 5240 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 5240 along the source-channel-drain direction, the gate electrode may consist of a U-shaped structure that includes a bottom portion substantially parallel to the surface of the die substrate 5202 and two sidewall portions that are substantially perpendicular to the top surface of the die substrate 5202. In other embodiments, at least one of the metal layers that form the gate electrode may simply be a planar layer that is substantially parallel to the top surface of the die substrate 5202 and does not include sidewall portions substantially perpendicular to the top surface of the die substrate 5202. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 5220 may be formed within the die substrate 5202 adjacent to the gate 5222 of individual transistors 5240. The S/D regions 5220 may be formed using an implantation/diffusion process or an etching/deposition process, for example. In the former process, dopants such as boron, aluminum, antimony, phosphorous, or arsenic may be ion-implanted into the die substrate 5202 to form the S/D regions 5220. An annealing process that activates the dopants and causes them to diffuse farther into the die substrate 5202 may follow the ion-implantation process. In the latter process, the die substrate 5202 may first be etched to form recesses at the locations of the S/D regions 5220. An epitaxial deposition process may then be carried out to fill the recesses with material that is used to fabricate the S/D regions 5220. In some implementations, the S/D regions 5220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 5220 may be formed using one or more alternate semiconductor materials such as germanium or a group III-V material or alloy. In further embodiments, one or more layers of metal and/or metal alloys may be used to form the S/D regions 5220.

Electrical signals, such as power and/or input/output (I/O) signals, may be routed to and/or from the devices (e.g., transistors 5240) of the device layer 5204 through one or more interconnect layers disposed on the device layer 5204 (illustrated in FIG. 52 as interconnect layers 5206-5210). For example, electrically conductive features of the device layer 5204 (e.g., the gate 5222 and the S/D contacts 5224) may be electrically coupled with the interconnect structures 5228 of the interconnect layers 5206-5210. The one or more interconnect layers 5206-5210 may form a metallization stack (also referred to as an "ILD stack") 5219 of the integrated circuit device 5200.

The interconnect structures 5228 may be arranged within the interconnect layers 5206-5210 to route electrical signals according to a wide variety of designs; in particular, the arrangement is not limited to the particular configuration of interconnect structures 5228 depicted in FIG. 52. Although a particular number of interconnect layers 5206-5210 is depicted in FIG. 52, embodiments of the present disclosure include integrated circuit devices having more or fewer interconnect layers than depicted.

In some embodiments, the interconnect structures 5228 may include lines 5228*a* and/or vias 5228*b* filled with an electrically conductive material such as a metal. The lines 5228*a* may be arranged to route electrical signals in a direction of a plane that is substantially parallel with a surface of the die substrate 5202 upon which the device layer 5204 is formed. For example, the lines 5228*a* may route electrical signals in a direction in and out of the page and/or in a direction across the page from the perspective of FIG.52. The vias 5228*b* may be arranged to route electrical signals in a direction of a plane that is substantially perpendicular to the surface of the die substrate 5202 upon which the device layer 5204 is formed. In some embodiments, the vias 5228*b* may electrically couple lines 5228*a* of different interconnect layers 5206-5210 together.

The interconnect layers 5206-5210 may include a dielectric material 5226 disposed between the interconnect structures 5228, as shown in FIG. 52. In some embodiments, dielectric material 5226 disposed between the interconnect structures 5228 in different ones of the interconnect layers 5206-5210 may have different compositions; in other embodiments, the composition of the dielectric material 5226 between different interconnect layers 5206-5210 may be the same. The device layer 5204 may include a dielectric material 5226 disposed between the transistors 5240 and a bottom layer of the metallization stack as well. The dielectric material 5226 included in the device layer 5204 may have a different composition than the dielectric material 5226 included in the interconnect layers 5206-5210; in other embodiments, the composition of the dielectric material 5226 in the device layer 5204 may be the same as a dielectric material 5226 included in any one of the interconnect layers 5206-5210.

A first interconnect layer 5206 (referred to as Metal 1 or "M1") may be formed directly on the device layer 5204. In some embodiments, the first interconnect layer 5206 may include lines 5228*a* and/or vias 5228*b*, as shown. The lines 5228*a* of the first interconnect layer 5206 may be coupled with contacts (e.g., the S/D contacts 5224) of the device layer 5204. The vias 5228*b* of the first interconnect layer 5206 may be coupled with the lines 5228*a* of a second interconnect layer 5208.

The second interconnect layer 5208 (referred to as Metal 2 or "M2") may be formed directly on the first interconnect layer 5206. In some embodiments, the second interconnect layer 5208 may include via 5228*b* to couple the lines 5228 of the second interconnect layer 5208 with the lines 5228*a* of a third interconnect layer 5210. Although the lines 5228*a* and the vias 5228*b* are structurally delineated with a line within individual interconnect layers for the sake of clarity, the lines 5228*a* and the vias 5228*b* may be structurally and/or materially contiguous (e.g., simultaneously filled during a dual-damascene process) in some embodiments.

The third interconnect layer 5210 (referred to as Metal 3 or "M3") (and additional interconnect layers, as desired) may be formed in succession on the second interconnect layer 5208 according to similar techniques and configurations described in connection with the second interconnect layer 5208 or the first interconnect layer 5206. In some embodiments, the interconnect layers that are "higher up" in the metallization stack 5219 in the integrated circuit device 5200 (i.e., farther away from the device layer 5204) may be thicker that the interconnect layers that are lower in the metallization stack 5219, with lines 5228*a* and vias 5228*b* in the higher interconnect layers being thicker than those in the lower interconnect layers.

The integrated circuit device 5200 may include a solder resist material 5234 (e.g., polyimide or similar material) and one or more conductive contacts 5236 formed on the interconnect layers 5206-5210. In FIG. 52, the conductive contacts 5236 are illustrated as taking the form of bond pads. The conductive contacts 5236 may be electrically coupled with the interconnect structures 5228 and configured to route the electrical signals of the transistor(s) 5240 to external devices. For example, solder bonds may be formed on the one or more conductive contacts 5236 to mechanically and/or electrically couple an integrated circuit die including the integrated circuit device 5200 with another component (e.g., a printed circuit board). The integrated circuit device 5200 may include additional or alternate structures to route the electrical signals from the interconnect layers 5206-5210; for example, the conductive contacts 5236 may include other analogous features (e.g., posts) that route the electrical signals to external components. The conductive contacts 5236 may serve as or be coupled to the conductive traces 102 or vias 104, as appropriate.

In some embodiments in which the integrated circuit device 5200 is a double-sided die, the integrated circuit device 5200 may include another metallization stack (not shown) on the opposite side of the device layer(s) 5204. This metallization stack may include multiple interconnect layers as discussed above with reference to the interconnect layers 5206-5210, to provide conductive pathways (e.g., including conductive lines and vias) between the device layer(s) 5204 and additional conductive contacts (not shown) on the opposite side of the integrated circuit device 5200 from the conductive contacts 5236. These additional conductive contacts may serve as or be coupled to the conductive traces 102 or vias 104, as appropriate.

In other embodiments in which the integrated circuit device 5200 is a double-sided die, the integrated circuit device 5200 may include one or more through silicon vias (TSVs) through the die substrate 5202; these TSVs may make contact with the device layer(s) 5204, and may provide conductive pathways between the device layer(s) 5204 and additional conductive contacts (not shown) on the opposite side of the integrated circuit device 5200 from the conductive contacts 5236. These additional conductive contacts may serve or be coupled to the conductive traces 102 or vias 104, as appropriate. Multiple integrated circuit devices 5200 may be stacked with one or more TSVs in the individual stacked devices provide connection between from one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 53:
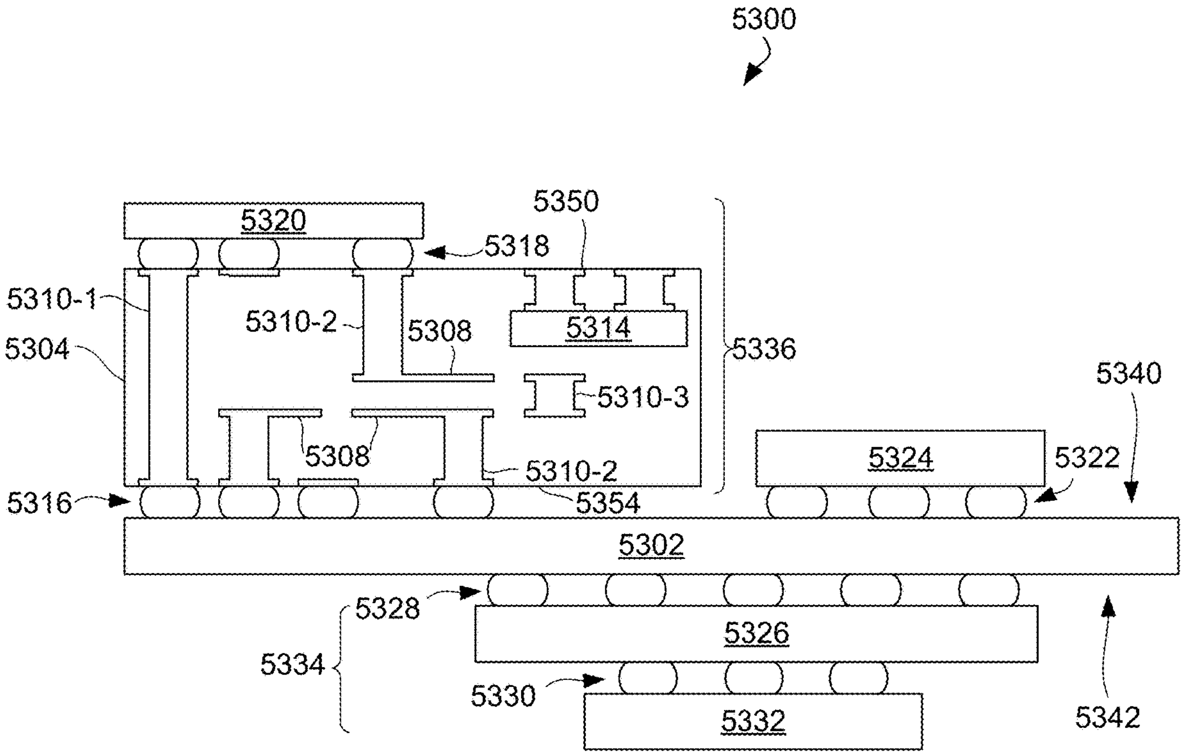
FIG. 53 is a cross-sectional side view of an integrated circuit device assembly that may include a microelectronic assembly, in accordance with any of the embodiments disclosed herein.

FIG. 53 is a cross-sectional side view of an integrated circuit device assembly 5300 that may include any of the systems 100 disclosed herein. In some embodiments, the integrated circuit device assembly 5300 may be part of or include the system 100. The integrated circuit device assembly 5300 includes a number of components disposed on a circuit board 5302 (which may be a motherboard, system board, mainboard, etc.). The integrated circuit device assembly 5300 includes components disposed on a first face 5340 of the circuit board 5302 and an opposing second face 5342 of the circuit board 5302; generally, components may be disposed on one or both faces 5340 and 5342. Any of the integrated circuit components discussed below with reference to the integrated circuit device assembly 5300 may take the form of any suitable ones of the embodiments of the system 100 disclosed herein.

In some embodiments, the circuit board 5302 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 5302. In other embodiments, the circuit board 5302 may be a non-PCB substrate. In some embodiments the circuit board 5302 may be, for example, the substrate 106. The integrated circuit device assembly 5300 illustrated in FIG. 53 includes a package-on-interposer structure 5336 coupled to the first face 5340 of the circuit board 5302 by coupling components 5316. The coupling components 5316 may electrically and mechanically couple the package-on-interposer structure 5336 to the circuit board 5302, and may include solder balls (as shown in FIG. 53), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 5316 may serve as the coupling components illustrated or described for any of the substrate assembly or substrate assembly components described herein, as appropriate.

The package-on-interposer structure 5336 may include an integrated circuit component 5320 coupled to an interposer 5304 by coupling components 5318. The coupling components 5318 may take any suitable form for the application, such as the forms discussed above with reference to the coupling components 5316. Although a single integrated circuit component 5320 is shown in FIG. 53, multiple integrated circuit components may be coupled to the interposer 5304; indeed, additional interposers may be coupled to the interposer 5304. The interposer 5304 may provide an intervening substrate used to bridge the circuit board 5302 and the integrated circuit component 5320.

The integrated circuit component 5320 may be a packaged or unpacked integrated circuit product that includes one or more integrated circuit dies (e.g., the die 5102 of FIG. 51, the integrated circuit device 5200 of FIG. 52) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 5320, a single monolithic integrated circuit die comprises solder bumps attached to contacts on the die. The solder bumps allow the die to be directly attached to the interposer 5304. The integrated circuit component 5320 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 5320 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 5320 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 5320 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 5304 may spread connections to a wider pitch or reroute a connection to a different connection. For example, the interposer 5304 may couple the integrated circuit component 5320 to a set of ball grid array (BGA) conductive contacts of the coupling components 5316 for coupling to the circuit board 5302. In the embodiment illustrated in FIG. 53, the integrated circuit component 5320 and the circuit board 5302 are attached to opposing sides of the interposer 5304; in other embodiments, the integrated circuit component 5320 and the circuit board 5302 may be attached to a same side of the interposer 5304. In some embodiments, three or more components may be interconnected by way of the interposer 5304.

In some embodiments, the interposer 5304 may be formed as a PCB, including multiple metal layers separated from one another by layers of dielectric material and interconnected by electrically conductive vias. In some embodiments, the interposer 5304 may be formed of an epoxy resin, a fiberglass-reinforced epoxy resin, an epoxy resin with inorganic fillers, a ceramic material, or a polymer material such as polyimide. In some embodiments, the interposer 5304 may be formed of alternate rigid or flexible materials that may include the same materials described above for use in a semiconductor substrate, such as silicon, germanium, and other group III-V and group IV materials. The interposer 5304 may include metal interconnects 5308 and vias 5310, including but not limited to through hole vias 5310-1 (that extend from a first face 5350 of the interposer 5304 to a second face 5354 of the interposer 5304), blind vias 5310-2 (that extend from the first or second faces 5350 or 5354 of the interposer 5304 to an internal metal layer), and buried vias 5310-3 (that connect internal metal layers).

In some embodiments, the interposer 5304 can comprise a silicon interposer. Through silicon vias (TSV) extending through the silicon interposer can connect connections on a first face of a silicon interposer to an opposing second face of the silicon interposer. In some embodiments, an interposer 5304 comprising a silicon interposer can further comprise one or more routing layers to route connections on a first face of the interposer 5304 to an opposing second face of the interposer 5304.

The interposer 5304 may further include embedded devices 5314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 5304. The package-on-interposer structure 5336 may take the form of any of the package-on-interposer structures known in the art. In embodiments where the interposer is a non-printed circuit board The integrated circuit device assembly 5300 may include an integrated circuit component 5324 coupled to the first face 5340 of the circuit board 5302 by coupling components 5322. The coupling components 5322 may take the form of any of the embodiments discussed above with reference to the coupling components 5316, and the integrated circuit component 5324 may take the form of any of the embodiments discussed above with reference to the integrated circuit component 5320.

The integrated circuit device assembly 5300 illustrated in FIG. 53 includes a package-on-package structure 5334 coupled to the second face 5342 of the circuit board 5302 by coupling components 5328. The package-on-package structure 5334 may include an integrated circuit component 5326 and an integrated circuit component 5332 coupled together by coupling components 5330 such that the integrated circuit component 5326 is disposed between the circuit board 5302 and the integrated circuit component 5332. The coupling components 5328 and 5330 may take the form of any of the embodiments of the coupling components 5316 discussed above, and the integrated circuit components 5326 and 5332 may take the form of any of the embodiments of the integrated circuit component 5320 discussed above. The package-on-package structure 5334 may be configured in accordance with any of the package-on-package structures known in the art.

Figure 54:
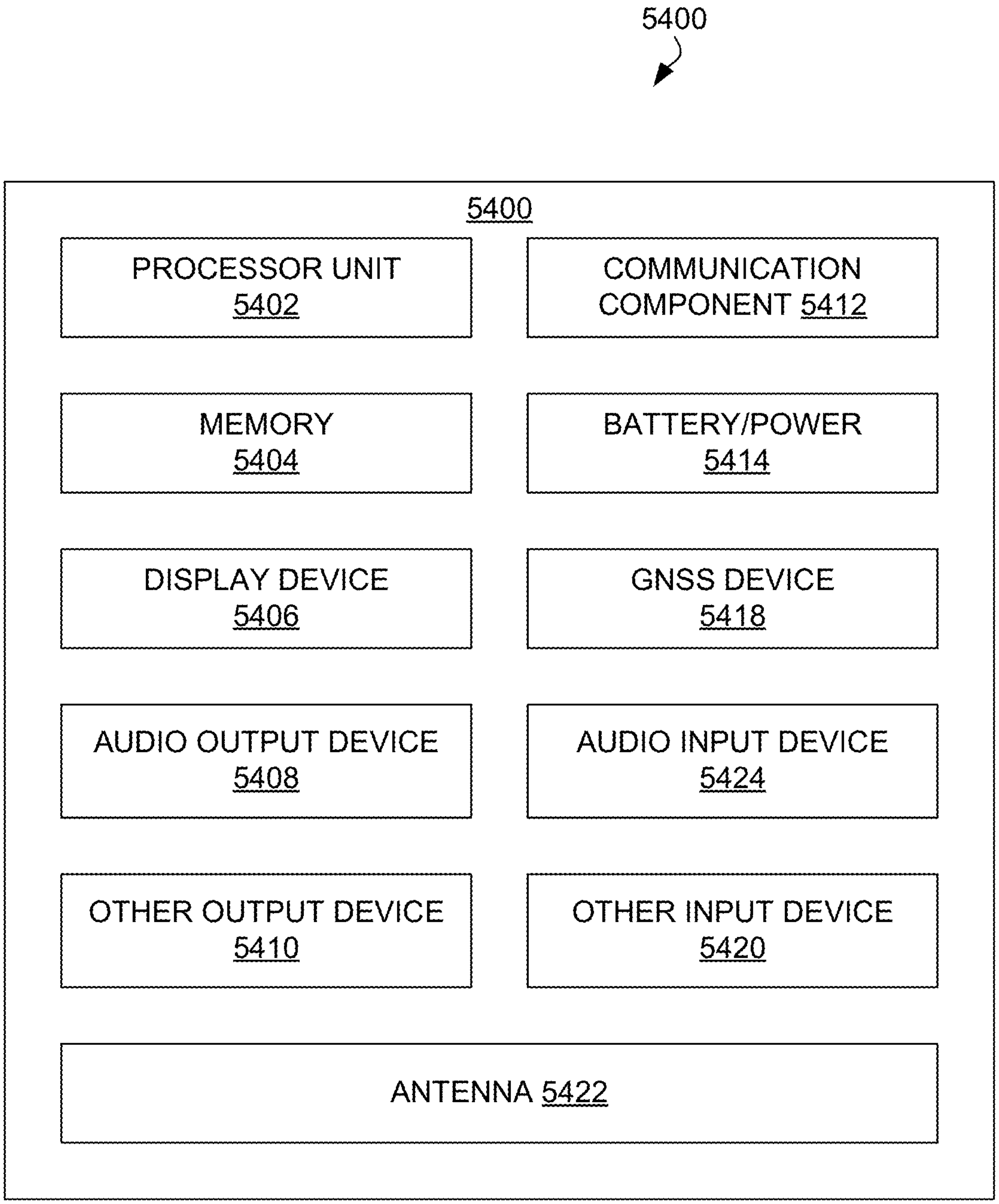
FIG. 54 is a block diagram of an example electrical device that may include a microelectronic assembly, in accordance with any of the embodiments disclosed herein.

FIG. 54 is a block diagram of an example electrical device 5400 that may include one or more of the system 100 disclosed herein. For example, any suitable ones of the components of the electrical device 5400 may include one or more of the integrated circuit device assemblies 5300, integrated circuit components 5320, integrated circuit devices 5200, or integrated circuit dies 5102 disclosed herein, and may be arranged in any of the systems 100 disclosed herein. A number of components are illustrated in FIG. 54 as included in the electrical device 5400, but any one or more of these components may be omitted or duplicated, as suitable for the application. In some embodiments, some or all of the components included in the electrical device 5400 may be attached to one or more motherboards mainboards, or system boards. In some embodiments, one or more of these components are fabricated onto a single system-on-a-chip (SoC) die.

Additionally, in various embodiments, the electrical device 5400 may not include one or more of the components illustrated in FIG. 54, but the electrical device 5400 may include interface circuitry for coupling to the one or more components. For example, the electrical device 5400 may not include a display device 5406, but may include display device interface circuitry (e.g., a connector and driver circuitry) to which a display device 5406 may be coupled. In another set of examples, the electrical device 5400 may not include an audio input device 5424 or an audio output device 5408, but may include audio input or output device interface circuitry (e.g., connectors and supporting circuitry) to which an audio input device 5424 or audio output device 5408 may be coupled.

The electrical device 5400 may include one or more processor units 5402 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 5402 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 5400 may include a memory 5404, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 5404 may include memory that is located on the same integrated circuit die as the processor unit 5402. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 5400 can comprise one or more processor units 5402 that are heterogeneous or asymmetric to another processor unit 5402 in the electrical device 5400. There can be a variety of differences between the processing units 5402 in a system in terms of a spectrum of metrics of merit including architectural, microarchitectural, thermal, power consumption characteristics, and the like. These differences can effectively manifest themselves as asymmetry and heterogeneity among the processor units 5402 in the electrical device 5400.

In some embodiments, the electrical device 5400 may include a communication component 5412 (e.g., one or more communication components). For example, the communication component 5412 can manage wireless communications for the transfer of data to and from the electrical device 5400. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 5412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 5412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 5412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 5412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 5412 may operate in accordance with other wireless protocols in other embodiments. The electrical device 5400 may include an antenna 5422 to facilitate wireless communications and/or to receive other wireless communications (such as AM or FM radio transmissions).

In some embodiments, the communication component 5412 may manage wired communications, such as electrical, optical, or any other suitable communication protocols (e.g., IEEE 802.3 Ethernet standards). As noted above, the communication component 5412 may include multiple communication components. For instance, a first communication component 5412 may be dedicated to shorter-range wireless communications such as Wi-Fi or Bluetooth, and a second communication component 5412 may be dedicated to longer-range wireless communications such as global positioning system (GPS), EDGE, GPRS, CDMA, WiMAX, LTE, EV-DO, or others. In some embodiments, a first communication component 5412 may be dedicated to wireless communications, and a second communication component 5412 may be dedicated to wired communications.

The electrical device 5400 may include battery/power circuitry 5414. The battery/power circuitry 5414 may include one or more energy storage devices (e.g., batteries or capacitors) and/or circuitry for coupling components of the electrical device 5400 to an energy source separate from the electrical device 5400 (e.g., AC line power).

The electrical device 5400 may include a display device 5406 (or corresponding interface circuitry, as discussed above). The display device 5406 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 5400 may include an audio output device 5408 (or corresponding interface circuitry, as discussed above). The audio output device 5408 may include any embedded or wired or wirelessly connected external device that generates an audible indicator, such speakers, headsets, or earbuds.

The electrical device 5400 may include an audio input device 5424 (or corresponding interface circuitry, as discussed above). The audio input device 5424 may include any embedded or wired or wirelessly connected device that generates a signal representative of a sound, such as microphones, microphone arrays, or digital instruments (e.g., instruments having a musical instrument digital interface (MIDI) output). The electrical device 5400 may include a Global Navigation Satellite System (GNSS) device 5418 (or corresponding interface circuitry, as discussed above), such as a Global Positioning System (GPS) device. The GNSS device 5418 may be in communication with a satellite-based system and may determine a geolocation of the electrical device 5400 based on information received from one or more GNSS satellites, as known in the art.

The electrical device 5400 may include an other output device 5410 (or corresponding interface circuitry, as discussed above). Examples of the other output device 5410 may include an audio codec, a video codec, a printer, a wired or wireless transmitter for providing information to other devices, or an additional storage device.

The electrical device 5400 may include an other input device 5420 (or corresponding interface circuitry, as discussed above). Examples of the other input device 5420 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 5400 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 5400 may be any other electronic device that processes data. In some embodiments, the electrical device 5400 may comprise multiple discrete physical components. Given the range of devices that the electrical device 5400 can be manifested as in various embodiments, in some embodiments, the electrical device 5400 can be referred to as a computing device or a computing system.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry. A computing system referred to as being programmed to perform a method can be programmed to perform the method via software, hardware, firmware or combinations thereof.

The computer-executable instructions or computer program products as well as any data created and used during implementation of the disclosed technologies can be stored on one or more tangible or non-transitory computer-readable storage media, such as optical media discs (e.g., DVDs, CDs), volatile memory components (e.g., DRAM, SRAM), or non-volatile memory components (e.g., flash memory, solid-state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, Python, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed through a suitable communication means. Such suitable communication means include, for example, the Internet, the World Wide Web, an intranet, cable (including fiber optic cable), magnetic communications, electromagnetic communications (including RF, microwave, and infrared communications), electronic communications, or other such communication means.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

EXAMPLES

Illustrative examples of the technologies disclosed herein are provided below. An embodiment of the technologies may include any one or more, and any combination of, the examples described below.

Example 1 includes a method comprising applying a first layer comprising a photoresist having a first photosensitivity to a substrate; applying a second layer comprising a photoresist having a second photosensitivity to the first layer comprising a photoresist, wherein the second photosensitivity is different from the first photosensitivity; exposing the first layer and the second layer with electromagnetic radiation with use of a multi-tone photomask, wherein the electromagnetic radiation through one or more gray regions of the multi-tone photomask exposes one and not the other of the first layer and the second layer; developing the first layer and the second layer, wherein the developed first layer defines a mold, wherein the mold comprises a conductive trace region and a via region, wherein the developed second layer comprises an overhang region that extends over the via region; filling the mold defined by the first layer with a conductive infill; and applying an etchant to the conductive infill, wherein the etchant etches the conductive infill from a top surface of the conductive infill to create a conductive trace in the conductive trace region, wherein the etchant laterally etches the conductive infill under the overhang region to create a via in the via region.

Example 2 includes the subject matter of Example 1, and wherein filling the mold defined by the first layer with the conductive infill comprises partially filling the mold defined by the first layer; applying an etch stop layer to the partial conductive infill; and completing the filling of the mold on top of the etch stop layer.

Example 3 includes the subject matter of any of Examples 1 and 2, and wherein applying the etchant to the conductive infill comprises applying the etchant to the conductive infill to remove the conductive infill in the conductive trace region until reaching the etch stop layer.

Example 4 includes the subject matter of any of Examples 1-3, and wherein the first layer comprises a negative photoresist material, and wherein the second layer comprises a negative photoresist material.

Example 5 includes the subject matter of any of Examples 1-4, and wherein the multi-tone photomask comprises one or more light regions, one or more dark regions, and one or more gray regions, wherein the electromagnetic radiation (i) exposes the first layer and the second layer through the one or more light regions, (ii) exposes the second layer through the one or more gray regions and does not expose the first layer through the one or more gray regions, and (iii) does not expose either the first layer or the second layer through the one or more dark regions, wherein the one or more dark regions define the conductive trace region, and wherein the one or more gray regions define the via region.

Example 6 includes the subject matter of any of Examples 1-5, and wherein the conductive infill comprises copper.

Example 7 includes the subject matter of any of Examples 1-6, and wherein the substrate comprises silicon.

Example 8 includes the subject matter of any of Examples 1-7, and wherein the substrate comprises a seed layer between the substrate and the first layer.

Example 9 includes the subject matter of any of Examples 1-8, and wherein a cross-sectional profile of the via has a concave shape with a narrower region distal from the substrate and a broader region proximal to the substrate.

Example 10 includes the subject matter of any of Examples 1-9, and wherein the conductive trace has a width between 0.5 and 4 micrometers and a height between 0.5 and 4 micrometers, wherein the via has a width that is within 0.1 micrometers of the width of the conductive trace.

Example 11 includes the subject matter of any of Examples 1-10, and further including creating a redistribution layer comprising the via and the conductive trace; and packaging the redistribution layer with one or more integrated circuits in a package.

Example 12 includes the subject matter of any of Examples 1-11, and further including creating a capacitor comprising the conductive trace and the via.

Example 13 includes the subject matter of any of Examples 1-12, and further including creating an inductor comprising the conductive trace and the via.

Example 14 includes a method comprising applying a first layer comprising a photoresist to a substrate; exposing the first layer; developing the first layer, wherein the developed first layer defines a mold; filling the mold defined by the first layer with a conductive infill; applying a second layer comprising a photoresist to the developed first layer and the conductive infill; exposing the second layer; developing the second layer, wherein the developed second layer does not extend over a conductive trace region of the mold, wherein the developed second layer comprises an overhang region that extends over a via region of the mold defined by the first layer; and applying an etchant to the conductive infill, wherein the etchant etches the conductive infill from a top surface of the conductive infill to create a conductive trace in the conductive trace region, wherein the etchant laterally etches the conductive infill under the overhang region to create a via in the via region.

Example 15 includes the subject matter of Example 14, and wherein filling the mold defined by the first layer with the conductive infill comprises partially filling the mold defined by the first layer; applying an etch stop layer to the partial conductive infill; and completing the filling of the mold on the etch stop layer.

Example 16 includes the subject matter of any of Examples 14 and 15, and wherein applying the etchant to the conductive infill comprises applying the etchant to the conductive infill to remove the conductive infill in the conductive trace region until reaching the etch stop layer.

Example 17 includes the subject matter of any of Examples 14-16, and wherein the developed second layer does not cover an area of the developed first layer adjacent the conductive trace region.

Example 18 includes the subject matter of any of Examples 14-17, and wherein the developed second layer does not cover an area of the developed first layer extending at least one micrometer from the conductive trace region.

Example 19 includes the subject matter of any of Examples 14-18, and wherein the conductive infill comprises copper.

Example 20 includes the subject matter of any of Examples 14-19, and wherein the substrate comprises silicon.

Example 21 includes the subject matter of any of Examples 14-20, and wherein the substrate comprises a seed layer between the substrate and the first layer.

Example 22 includes the subject matter of any of Examples 14-21, and wherein a cross-sectional profile of the via has a concave shape with a narrower region distal from the substrate and a broader region proximal to the substrate.

Example 23 includes the subject matter of any of Examples 14-22, and wherein the conductive trace has a width between 0.5 and 4 micrometers and a height between 0.5 and 4 micrometers, wherein the via has a width that is within 0.1 micrometers of the width of the conductive trace.

Example 24 includes the subject matter of any of Examples 14-23, and further including creating a redistribution layer comprising the via and the conductive trace; and packaging the redistribution layer with one or more integrated circuits in a package.

Example 25 includes the subject matter of any of Examples 14-24, and further including creating a capacitor comprising the conductive trace and the via.

Example 26 includes the subject matter of any of Examples 14-25, and further including creating an inductor comprising the conductive trace and the via.

Example 27 includes an apparatus comprising a plurality of conductive traces on a substrate; and a plurality of vias, wherein individual vias of the plurality of vias are connected to individual conductive traces of the plurality of conductive trace, wherein a cross-sectional profile of individual vias of the plurality of vias has a concave shape with a narrower region distal from the substrate and a broader region proximal to the substrate, wherein individual vias of the plurality of vias have a width that is within 0.1 micrometers of a width of the connected conductive trace.

Example 28 includes the subject matter of Example 27, and wherein individual conductive traces of the plurality of conductive traces have a width between 0.5 and 4 micrometers, wherein a pitch of the plurality of conductive traces is less than three times the width of individual conductive traces of the plurality of conductive traces, wherein a pitch of the plurality of vias is less than three times the width of individual conductive traces of the plurality of conductive traces.

Example 29 includes the subject matter of any of Examples 27 and 28, and further including a plurality of etch stop layers, wherein individual etch stop layers of the plurality of etch stop layers are on a surface of individual conductive traces of the plurality of conductive traces, wherein individual etch stop layers of the plurality of etch stop layers bisect individual vias of the plurality of vias.

Example 30 includes a method comprising a step for applying a first layer comprising a photoresist and a second layer comprising a photoresist to a substrate, wherein the second layer has an overhang region that extends over a region of the substrate not covered by the first layer; a step for filling a mold defined by the first layer with a conductive infill; and a step for etching the conductive infill to create a conductive trace and a via.

Example 31 includes the subject matter of Example 30, and wherein the step for applying the first layer and the second layer comprises applying the first layer comprising a photoresist having a first photosensitivity to the substrate; applying the second layer comprising a photoresist having a second photosensitivity to the first layer, wherein the second photosensitivity is different from the first photosensitivity; exposing the first layer and the second layer with electromagnetic radiation with use of a multi-tone photomask, wherein the electromagnetic radiation through one or more gray regions of the multi-tone photomask exposes one and not the other of the first layer and the second layer; and developing the first layer and the second layer, wherein the developed first layer defines a mold, wherein the mold comprises a conductive trace region and a via region, wherein the developed second layer comprises the overhang region that extends over the via region.

Example 32 includes the subject matter of any of Examples 30 and 31, and wherein the step for applying the first layer and the second layer comprises applying the first layer to the substrate; exposing the first layer; developing the first layer, wherein the developed first layer defines a mold; filling the mold defined by the first layer with the conductive infill; applying the second layer to the developed first layer and the conductive infill; exposing the second layer; and developing the second layer, wherein the developed second layer does not extend over a conductive trace region of the mold, wherein the developed second layer comprises the overhang region that extends over a via region of the mold defined by the first layer.

The invention claimed is:

1. A method comprising:

applying a first layer comprising a photoresist having a first photosensitivity to a substrate;

applying a second layer comprising a photoresist having a second photosensitivity to the first layer comprising a photoresist, wherein the second photosensitivity is different from the first photosensitivity;

exposing the first layer and the second layer with electromagnetic radiation with use of a multi-tone photomask, wherein the electromagnetic radiation through one or more gray regions of the multi-tone photomask exposes one and not the other of the first layer and the second layer;

developing the first layer and the second layer, wherein the developed first layer defines a mold, wherein the mold comprises a conductive trace region and a via region, wherein the developed second layer comprises an overhang region that extends over the via region;

filling the mold defined by the first layer with a conductive infill; and applying an etchant to the conductive infill, wherein the etchant etches the conductive infill from a top surface of the conductive infill to create a conductive trace in the conductive trace region, wherein the etchant laterally etches the conductive infill under the overhang region to create a via in the via region.

2. The method of claim 1, wherein filling the mold defined by the first layer with the conductive infill comprises:

partially filling the mold defined by the first layer;

applying an etch stop layer to the partial conductive infill; and completing the filling of the mold on top of the etch stop layer.

3. The method of claim 2, wherein applying the etchant to the conductive infill comprises applying the etchant to the conductive infill to remove the conductive infill in the conductive trace region until reaching the etch stop layer.

4. The method of claim 1, wherein the first layer comprises a negative photoresist material, and wherein the second layer comprises a negative photoresist material.

5. The method of claim 4, wherein the multi-tone photomask comprises one or more light regions, one or more dark regions, and one or more gray regions, wherein the electromagnetic radiation (i) exposes the first layer and the second layer through the one or more light regions, (ii) exposes the second layer through the one or more gray regions and does not expose the first layer through the one or more gray regions, and (iii) does not expose either the first layer or the second layer through the one or more dark regions, wherein the one or more dark regions define the conductive trace region, and wherein the one or more gray regions define the via region.

6. The method of claim 1, wherein the conductive infill comprises copper.

7. The method of claim 1, wherein the substrate comprises silicon.

8. The method of claim 1, wherein the substrate comprises a seed layer between the substrate and the first layer.

9. The method of claim 1, wherein a cross-sectional profile of the via has a concave shape with a narrower region distal from the substrate and a broader region proximal to the substrate.

10. The method of claim 1, wherein the conductive trace has a width between 0.5 and 4 micrometers and a height between 0.5 and 4 micrometers, wherein the via has a width that is within 0.1 micrometers of the width of the conductive trace.

11. The method of claim 1, further comprising:

creating a redistribution layer comprising the via and the conductive trace; and packaging the redistribution layer with one or more integrated circuits in a package.

12. The method of claim 1, further comprising creating a capacitor comprising the conductive trace and the via.

13. The method of claim 1, further comprising creating an inductor comprising the conductive trace and the via.

14. The method of claim 1, wherein the multi-tone photomask comprises one or more light regions, one or more dark regions, and one or more gray regions, wherein the one or more light regions allow more light to pass through at a design wavelength than the one or more gray regions, wherein the one or more gray regions allow more light to pass through at the design wavelength than the one or more dark regions, wherein at least one of the one or more light regions is adjacent to the one or more dark regions without an intervening gray region of the one or more gray regions.

15. A method comprising:

applying a first layer comprising a photoresist to a substrate;

exposing the first layer;

developing the first layer, wherein the developed first layer defines a mold;

filling the mold defined by the first layer with a conductive infill;

applying a second layer comprising a photoresist to the developed first layer and the conductive infill;

exposing the second layer;

developing the second layer, wherein the developed second layer does not extend over a conductive trace region of the mold, wherein the developed second layer comprises an overhang region that extends over a via region of the mold defined by the first layer; and applying an etchant to the conductive infill, wherein the etchant etches the conductive infill from a top surface of the conductive infill to create a conductive trace in the conductive trace region, wherein the etchant laterally etches the conductive infill under the overhang region to create a via in the via region.

16. The method of claim 15, wherein filling the mold defined by the first layer with the conductive infill comprises:

partially filling the mold defined by the first layer;

applying an etch stop layer to the partial conductive infill; and completing the filling of the mold on the etch stop layer.

17. The method of claim 16, wherein applying the etchant to the conductive infill comprises applying the etchant to the conductive infill to remove the conductive infill in the conductive trace region until reaching the etch stop layer.

18. The method of claim 15, wherein the developed second layer does not cover an area of the developed first layer adjacent the conductive trace region.

19. The method of claim 18, wherein the developed second layer does not cover an area of the developed first layer extending at least one micrometer from the conductive trace region.

20. A method comprising:

a step for applying a first layer comprising a photoresist and a second layer comprising a photoresist to a substrate, wherein the second layer has an overhang region that extends over a region of the substrate not covered by the first layer;

a step for filling a mold defined by the first layer with a conductive infill; and a step for etching the conductive infill to create a conductive trace by removing part of the conductive infill adjacent to the conductive trace and a via by removing part of the conductive infill adjacent to the via.

21. The method of claim 20, wherein the step for applying the first layer and the second layer comprises:

applying the first layer comprising a photoresist having a first photosensitivity to the substrate;

applying the second layer comprising a photoresist having a second photosensitivity to the first layer, wherein the second photosensitivity is different from the first photosensitivity;

exposing the first layer and the second layer with electromagnetic radiation with use of a multi-tone photomask, wherein the electromagnetic radiation through one or more gray regions of the multi-tone photomask exposes one and not the other of the first layer and the second layer; and developing the first layer and the second layer, wherein the developed first layer defines a mold, wherein the mold comprises a conductive trace region and a via region, wherein the developed second layer comprises the overhang region that extends over the via region.

22. The method of claim 20, wherein the step for applying the first layer and the second layer comprises:

applying the first layer to the substrate;

exposing the first layer;

developing the first layer, wherein the developed first layer defines a mold;

filling the mold defined by the first layer with the conductive infill;

applying the second layer to the developed first layer and the conductive infill;

exposing the second layer; and developing the second layer, wherein the developed second layer does not extend over a conductive trace region of the mold, wherein the developed second layer comprises the overhang region that extends over a via region of the mold defined by the first layer.

23. A method for fabricating an electronic component comprising:

applying photoresist layers to a substrate;

exposing and developing the photoresist layers to form a mold defining multiple conductive regions and multiple via regions;

filling the mold with a conductive material;

etching the conductive material while using an overhang structure to protect portions of the conductive material in the via regions, thereby forming multiple conductive traces and multiple vias that are aligned to the conductive traces; and arranging the multiple conductive traces and multiple vias to form an electronic component selected from the group consisting of a capacitor, an inductor, a resistor, and a transmission line.

24. The method of claim 23, wherein arranging the multiple conductive traces and multiple vias to form the electronic component comprises:

forming a first conductive trace on a first layer;

forming a second conductive trace on a second layer different from the first layer;

forming a via connecting the first conductive trace and the second conductive trace; and positioning a third conductive trace to form a capacitor with the first and second conductive traces.

25. The method of claim 23, wherein arranging the multiple conductive traces and multiple vias to form the electronic component comprises:

forming the multiple conductive traces in a spiral configuration across multiple layers; and forming the multiple vias to connect the conductive traces between the multiple layers to create a current path that spirals through the multiple layers, thereby forming an inductor.

* * * * *